(12) United States Patent
Meitl et al.

(10) Patent No.: US 10,223,962 B2
(45) Date of Patent: Mar. 5, 2019

(54) DISPLAY WITH FUSED LEDS

(71) Applicant: X-Celeprint Limited, Cork (IE)

(72) Inventors: Matthew Meitl, Durham, NC (US); Ronald S. Cok, Rochester, NY (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 15/438,319

(22) Filed: Feb. 21, 2017

(65) Prior Publication Data

US 2017/0270852 A1    Sep. 21, 2017

Related U.S. Application Data

(60) Provisional application No. 62/311,288, filed on Mar. 21, 2016.

(51) Int. Cl.
| | |
|---|---|
| G09G 3/20 | (2006.01) |
| G09G 3/32 | (2016.01) |
| H01L 27/02 | (2006.01) |

(52) U.S. Cl.
CPC ........... *G09G 3/32* (2013.01); *H01L 27/0288* (2013.01); *G09G 3/2003* (2013.01);
(Continued)

(58) Field of Classification Search
CPC ............... G09G 3/32; G09G 2330/045; G09G 2330/08; G09G 2300/0452; G09G 3/2003; G09G 2300/0426; H01L 27/0288
See application file for complete search history.

(56) References Cited

U.S. PATENT DOCUMENTS

| 5,621,555 A | 4/1997 | Park |
| 6,577,367 B2 | 6/2003 | Kim |
| | (Continued) | |

FOREIGN PATENT DOCUMENTS

| JP | 2011066130 A | 3/2011 |
| WO | WO-2005/078691 A2 | 8/2005 |
| | (Continued) | |

OTHER PUBLICATIONS

Hamer et al., 63.2: AMOLED Displays Using Transfer-Printed Integrated Circuits, SID 09 Digest, 40(2):947-950 (2009).

(Continued)

*Primary Examiner* — Nitin Patel
*Assistant Examiner* — Amy Onyekaba
(74) *Attorney, Agent, or Firm* — William R. Haulbrook; Michael D. Schmitt; Choate, Hall & Stewart LLP

(57) ABSTRACT

A display having fused light-emitting diodes (LEDs) includes a display substrate and an array of pixel components disposed on the display substrate. Each pixel component comprises a light-emitting diode and an electrical fuse electrically connected in series with the light-emitting diode. The micro-transfer printable pixel components include an LED having first and second LED electrical contacts for providing power to the LED to cause the LED to emit light, a fuse having first and second fuse electrical contacts, the first fuse electrical contact electrically connected in series with the first LED electrical contact, a first electrode connected to the second fuse electrical contact, and a second electrode connected to the second LED electrical contact.

13 Claims, 19 Drawing Sheets

(52) U.S. Cl.
CPC ............... *G09G 2300/0426* (2013.01); *G09G 2300/0452* (2013.01); *G09G 2330/045* (2013.01); *G09G 2330/08* (2013.01)

(56) References Cited

U.S. PATENT DOCUMENTS

| | | | |
|---|---|---|---|
| 7,012,382 B2 | 3/2006 | Cheang et al. | |
| 7,195,733 B2 | 3/2007 | Rogers et al. | |
| 7,354,801 B2 | 4/2008 | Sugiyama et al. | |
| 7,622,367 B1 | 11/2009 | Nuzzo et al. | |
| 7,943,491 B2 | 5/2011 | Nuzzo et al. | |
| 7,982,296 B2 | 7/2011 | Nuzzo et al. | |
| 8,039,847 B2 | 10/2011 | Nuzzo et al. | |
| 8,440,546 B2 | 5/2013 | Nuzzo et al. | |
| 8,506,867 B2 | 8/2013 | Menard | |
| 8,722,458 B2 | 5/2014 | Rogers et al. | |
| 8,766,970 B2 | 7/2014 | Chien et al. | |
| 8,791,474 B1 | 7/2014 | Bibl et al. | |
| 8,835,940 B2 | 9/2014 | Hu et al. | |
| 8,889,485 B2 | 11/2014 | Bower | |
| 9,153,171 B2 | 10/2015 | Sakariya et al. | |
| 9,226,361 B2 | 12/2015 | Toth | |
| 9,626,908 B2 | 4/2017 | Sakariya et al. | |
| 9,980,341 B2 | 5/2018 | Bower et al. | |
| 2002/0036471 A1* | 3/2002 | Silvestre | G09G 3/30 315/160 |
| 2004/0183067 A1* | 9/2004 | Strip | H01L 27/3202 257/40 |
| 2005/0174064 A1* | 8/2005 | Agostinelli | G09G 3/3216 315/169.3 |
| 2005/0264472 A1 | 12/2005 | Rast | |
| 2006/0238466 A1* | 10/2006 | Chen | G09G 3/3406 345/82 |
| 2013/0278144 A1* | 10/2013 | Levermore | H01L 51/5203 315/121 |
| 2014/0084482 A1 | 3/2014 | Hu et al. | |
| 2014/0217448 A1 | 8/2014 | Kim et al. | |
| 2014/0340900 A1 | 11/2014 | Bathurst et al. | |
| 2015/0169011 A1 | 6/2015 | Bibl et al. | |
| 2015/0371585 A1* | 12/2015 | Bower | G09G 3/32 345/1.1 |
| 2016/0013252 A1* | 1/2016 | Wang | H01L 27/3213 345/206 |
| 2016/0056725 A1 | 2/2016 | Kim et al. | |
| 2016/0057822 A1 | 2/2016 | Chu | |
| 2016/0057827 A1 | 2/2016 | Miskin | |
| 2016/0057832 A1 | 2/2016 | Briggs et al. | |
| 2016/0093600 A1 | 3/2016 | Bower et al. | |
| 2017/0206845 A1 | 7/2017 | Sakariya et al. | |
| 2018/0007750 A1 | 1/2018 | Meitl et al. | |
| 2018/0084614 A1 | 3/2018 | Bower et al. | |

FOREIGN PATENT DOCUMENTS

| | | |
|---|---|---|
| WO | WO-2014/149864 A1 | 9/2014 |
| WO | WO-2017/162629 A1 | 9/2017 |

OTHER PUBLICATIONS

International Search Report, PCT/EP2017/056628, 3 pages, dated Jun. 27, 2017.

Written Opinion, PCT/EP2017/056628, 9 pages, dated Jun. 27, 2017.

* cited by examiner

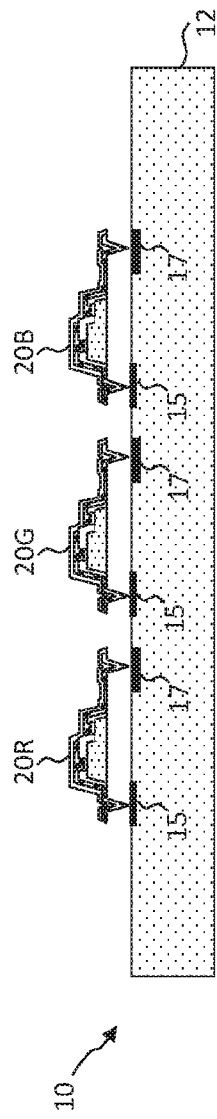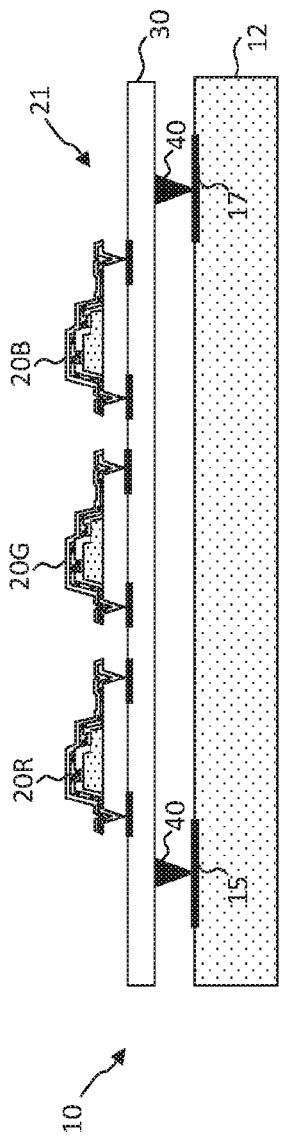

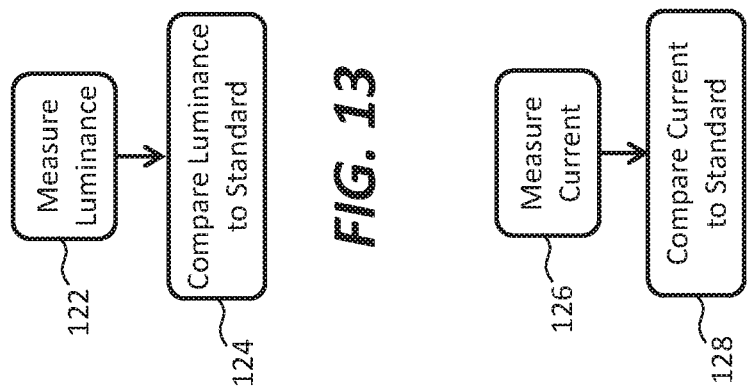
FIG. 13
FIG. 14
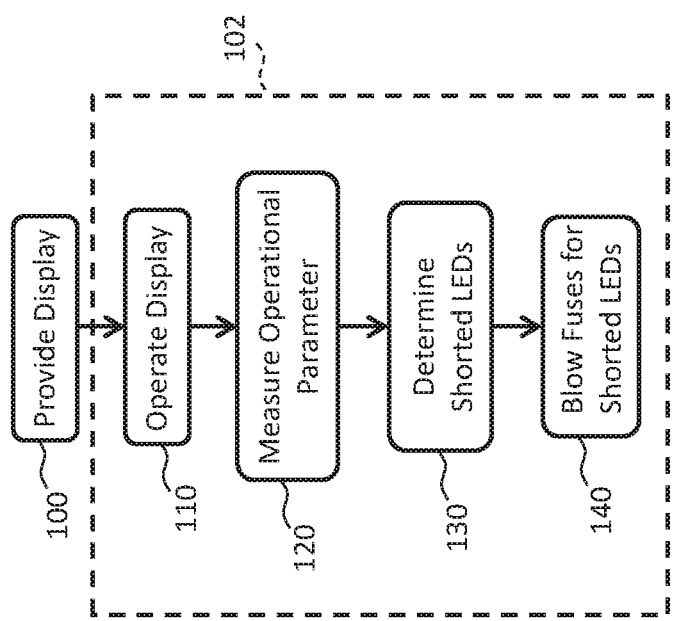
FIG. 12

DISPLAY WITH FUSED LEDS

PRIORITY APPLICATION

This application claims priority to and benefit of U.S. Patent Application No. 62/311,288, filed Mar. 21, 2016, entitled Display with Fused LEDs, the content of which is hereby incorporated by reference in its entirety.

FIELD OF THE INVENTION

The present invention relates to displays with inorganic light-emitting diode pixels.

BACKGROUND OF THE INVENTION

Flat-panel displays are widely used in conjunction with computing devices, in portable devices, and for entertainment devices such as televisions. Such displays typically employ a plurality of pixels distributed over a display substrate to display images, graphics, or text. In a color display, each pixel includes light emitters that emit light of different colors, such as red, green, and blue. For example, liquid crystal displays (LCDs) employ liquid crystals to block or transmit light from a backlight behind the liquid crystals and organic light-emitting diode (OLED) displays rely on passing current through a layer of organic material that glows in response to the current. Displays using inorganic light emitting diodes (LEDs) are also in widespread use for outdoor signage and have been demonstrated in a 55-inch television.

Inorganic light-emitting diode displays using inorganic micro-LEDs on a display substrate are also known. Micro-LEDs can have an area less than 1 mm square, less than 100 microns square, or less than 50 microns square or have an area small enough that it is not visible to an unaided observer of the display at a designed viewing distance. U.S. Pat. No. 8,722,458 entitled Optical Systems Fabricated by Printing-Based Assembly teaches transferring light-emitting, light-sensing, or light-collecting semiconductor elements from a wafer substrate to a destination substrate.

In any application requiring many elements, it is important that each element is reliable to ensure good manufacturing yields and performance. Active-matrix control circuits, as well as the controlled element (e.g., a light emitter) are subject to failure. Because no manufacturing process is perfect, any large system can have defective elements. In particular, inorganic light-emitting diodes are subject to manufacturing defects that increase the amount of current passing through the LED when provided with power, resulting in an undesirable brightness, power usage, or system control problems.

An undesired increase in current can also overheat the LEDs. One approach to preventing such overheating is to provide each LED pixel with a resistor or group of resistors in series with the LED, as is described in U.S. Pat. No. 9,226,361. U.S. Patent Application Publication No. 20160057827 discloses a current-limiting diode in an LED circuit for a lighting system with both forward-biased and reverse-biased LEDs and a polarity switching device. Circuits for sensing current levels and reducing power dissipation are also known, for example as taught in U.S. Patent Application Publication Nos. 20160057822 and 20160057832 as are voltage control circuits, for example as described in U.S. Patent Application Publication No. 20160056725. However, these approaches either require complex or expensive circuit components in association with each LED or result in diminished light output.

Alternatively, to ensure that large multi-element systems are reliably manufactured and operated, such systems can employ redundant elements. For example, displays are sometimes designed with redundant light emitters. U.S. Pat. No. 5,621,555 describes an LCD with redundant pixel electrodes and thin-film transistors to reduce defects. In another approach described in U.S. Pat. No. 6,577,367, an extra row or column of pixels is provided to replace any defective row or column. An alternative approach to improving display yields uses additional, redundant light-emitting elements, for example two light emitters for every desired light emitter in the display. U.S. Pat. No. 8,766,970 discloses a pixel circuit with two sub-pixels and circuitry to determine whether a sub-pixel is to be enabled, for example if another sub-pixel is faulty. Similarly, U.S. Pat. No. 7,012,382 teaches an LED-based lighting system that includes a primary light source and at least one redundant light source. The primary light source is activated by itself and the performance of the light source is measured to determine whether or not to drive the redundant light source. The redundant light source is activated when the performance measurements indicate that a performance characteristic is not being met by the primary light source alone. The first light system can be activated in combination with the redundant light source once the decision is made to activate the redundant light source. U.S. Pat. No. 8,791,474 discloses redundant pairs of micro LED devices driven by a common transistor. WO 2014149864 describes separately controlled micro-LED devices. However, the use of redundant emitters is expensive and does not address problems with LEDs that conduct too much current.

There is a need, therefore, for LED pixel circuits that can control or avoid problems resulting from LEDs in a display that undesirably conduct too much current.

SUMMARY OF THE INVENTION

The present invention includes embodiments of a display having an array of fused light-emitting diodes. The display includes a display substrate with an array of pixel components disposed on, over, or in the display substrate. Each pixel component has at least one light-emitting diode and at least one electrical fuse. Each electrical fuse is electrically connected in series to at least one light-emitting diode. In more detail, a micro-transfer printable pixel component includes an LED having first and second LED electrical contacts for providing power to the LED to cause the LED to emit light, and a fuse having first and second fuse electrical contacts, the first fuse electrical contact electrically connected in series with the first LED electrical contact. A first electrical conductor is connected to the second fuse electrical contact and a second electrical conductor is connected to the second LED electrical contact.

In another embodiment, a micro-transfer printable pixel component wafer includes a pixel wafer having a patterned sacrificial layer forming an array of sacrificial portions separated by anchors and a plurality of pixel components. Each pixel component is disposed entirely on or over a corresponding sacrificial portion.

A fuse is an electrically conductive, sacrificial, low-resistance resistor providing overcurrent protection that becomes permanently non-conductive when a pre-determined current passes through the fuse.

The pixel components can each include a plurality of LEDs and a corresponding plurality of electrical fuses, each electrical fuse electrically connected in series with a corresponding LED. The plurality of LEDs can include red, green, and blue light-emitting diodes forming full-color pixel components in a full-color pixel of a display. Each different color of LED can have a fuse that has a different current rating. Alternatively, a single electrical fuse can be electrically connected in series with multiple LEDs.

The LEDs can be tested for short circuits (for example, an improperly large electrical conduction resulting in an over-current when electrical power is supplied) with a forward-biased voltage or with a reverse-biased voltage. If too much current flows through the LED, too much current also flows through the fuse, the fuse is blown, and the LED will no longer operate in an LED control circuit.

The LEDs in the display can be operated, tested, or rendered non-conductive with a fuse controller. The fuse controller can be a circuit that provides sufficient electrical current to blow the fuse as part of a test. In an embodiment, the fuse controller can also operate the LEDs in the display to display an image. The fuse controller can be, or be part of, a passive-matrix display controller or an active-matrix display controller for a matrix-addressed display, and can be or can include row or column controllers, or both. If the fuse controller is an active-matrix display controller, the pixel components can include a pixel controller to provide local pixel information storage and pixel control. The pixel controller is electrically connected to the one or more LEDs and fuses in a pixel component and can also provide sufficient current to render the fuses non-conductive.

The LEDs or fuses, or both, can be provided as micro-transfer printable components, either in individual packages or together in one component. In another embodiment, the LED and fuse, or multiple LEDs and one or more fuses such as in a full-color display pixel, are mounted and electrically connected on a pixel substrate separate, independent, and distinct from the display substrate. The pixel substrate is then mounted on the display substrate. The pixel substrate can also be a micro-transfer printable component. The LEDs, fuses, or pixel substrates, or any combination of the LEDs, fuses, and pixel substrates, can be provided in components with connection posts that enable electrical connections to electrical conductors on a destination substrate (such as a display substrate) on which the component is micro-transfer printed.

A method of making a micro-transfer printable pixel component includes providing a pixel wafer having a patterned sacrificial layer forming an array of sacrificial portions separated by anchors. One or more LEDs are disposed on the pixel wafer entirely in, on, or over a sacrificial portion, for example by micro-transfer printing. Each LED has first and second LED electrical contacts for providing power to the LED to cause the LED to emit light. One or more fuses having first and second fuse electrical contacts are also disposed entirely in, on, or over the sacrificial portion. The fuse(s) can be disposed by micro-transfer printing or by forming the fuse over the sacrificial portion using photolithographic methods. At least one first fuse electrical contact is electrically connected in series with the first LED electrical contact. A first electrical conductor is provided and electrically connected to the second fuse electrical contact and a second electrical conductor is provided and electrically connected to the second LED electrical contact.

Embodiments of the present invention provide a simple way to overcome LED manufacturing faults in a display and enables simple detection, correction, and repair.

In one aspect, the disclosed technology includes a display having fused light-emitting diodes (LEDs), including: a display substrate; and an array of pixel components disposed on, over, or in the display substrate, each pixel component comprising: a light-emitting diode, and an electrical fuse electrically connected in series with the corresponding light-emitting diode.

In certain embodiments, each pixel component comprises a plurality of LEDs, the plurality of LEDs electrically connected in series or in parallel, and the electrical fuse electrically connected in series with all of the plurality of LEDs.

In certain embodiments, each pixel component comprises a plurality of LEDs, each LED having a separate electrical fuse electrically connected in series with the LED.

In certain embodiments, each pixel component comprises a red LED that emits red light, a green LED that emits green light, and a blue LED that emits blue light, and wherein the red, green, and blue LEDs are electrically connected to a common electrical connection or wherein the separate electrical fuses are electrically connected to a common electrical connection.

In certain embodiments, each pixel component comprises a red LED that emits red light, a green LED that emits green light, a blue LED that emits blue light, a red electrical fuse, a green electrical fuse, and a blue electrical fuse, wherein the red LED is electrically connected in series with the red fuse, the green LED is electrically connected in series with the green fuse, and the blue LED is electrically connected in series with the blue fuse, and at least one of the red, green, and blue fuses is rendered non-conductive with a different amount of electrical power than another of the red, green, or blue fuses.

In certain embodiments, the display includes a fuse controller that provides sufficient electrical power to render each fuse non-conductive.

In certain embodiments, the fuse controller provides electrical power to the LEDS in a forward-biased direction.

In certain embodiments, the fuse controller provides electrical power to the LEDS in a reverse-biased direction.

In certain embodiments, the fuse controller provides image control signals that cause the array of LEDs to display an image and fuse control signals that can render each fuse non-conductive.

In certain embodiments, the fuse controller is a passive-matrix controller.

In certain embodiments, the fuse controller is an active-matrix controller and wherein each pixel component comprises a pixel controller electrically connected to the LED, the pixel controller comprising circuitry that, in combination with the fuse controller, provides sufficient electrical power to render each fuse non-conductive.

In certain embodiments, one or more of the fuses comprises separate conductors connected in parallel.

In certain embodiments, the display includes an array of row conductors formed on, in, or over the display substrate, the row conductors extending in a row direction, and an array of column conductors formed on, in, or over the display substrate, the column conductors extending in a column direction different from the row direction, and wherein a pixel component is electrically connected to each combination of row conductors and column conductors.

In certain embodiments, the display includes a redundant pixel component electrically connected to each combination of row conductors and column conductors in parallel with each pixel component, each redundant pixel component comprising a light-emitting diode and an electrical fuse electrically connected in series with the light-emitting diode.

In certain embodiments, each pixel component comprises a pixel substrate separate, independent, distinct from the display substrate and the pixel substrates are disposed on the display substrate.

In certain embodiments, the fuses, the LEDs, or the pixel components are provided in a micro-transfer printable component.

In certain embodiments, each pixel component is provided in a micro-transfer printable component and either or both of the fuses and the LEDs are provided in a micro-transfer printable component.

In certain embodiments, the fuses, the LEDs, or the pixel components are replaceable.

In another aspect, the disclosed technology includes a method of operating a display having fused light-emitting diodes (LEDs), including: providing a display, the display comprising a display substrate and an array of pixel components disposed on, over, or in the display substrate, each pixel component comprising a light-emitting diode and an electrical fuse electrically connected in series with the corresponding light-emitting diode; operating the display to determine the operational status of the LEDs; determining the LEDs that have an electrical short; and providing an electrical current through the shorted LEDs and through the corresponding fuses electrically connected in series to the shorted LEDs that renders the fuses non-conductive.

In certain embodiments, the method includes operating the display so that the LEDs emit light, measuring the luminance of each LED, and comparing the light emitted from the LEDs to a predetermined desired luminance to determine the operational status of the LEDs.

In certain embodiments, the method includes operating the display so that the LEDs conduct electrical current, measuring the current conducted through each LED or the voltage across each LED or pixel component, and comparing the current conducted through each LED to a predetermined desired current to determine the operational status of the LEDs or comparing the voltage across each LED or pixel component to a predetermined desired voltage to determine the operational status of the LEDs.

In certain embodiments, the method includes operating all of the LEDs in the display at a time, operating all of the LEDS in a row at a time and sequentially operating rows of LEDS, operating all of the LEDS in a column at a time and sequentially operating columns of LEDS, or sequentially operating the LEDS.

In certain embodiments, the method includes providing an electrical current through all of the shorted LEDs and corresponding fuses electrically connected to the shorted LEDs at a time, providing an electrical current through all of the shorted LEDs and corresponding fuses electrically connected to the shorted LEDs in a row or column at a time, or sequentially providing an electrical current through each of the shorted LEDs and corresponding fuses electrically connected to the shorted LEDs.

In certain embodiments, the method includes providing the electrical current in a forward-biased direction.

In certain embodiments, the method includes providing the electrical current in a reverse-biased direction.

In certain embodiments, the method includes replacing shorted LEDs and the corresponding fuse.

In certain embodiments, the method includes providing a redundant pixel component in parallel with a shorted pixel component.

In certain embodiments, the steps of operating the display to determine the operational status of the LEDs and determining the LEDs that have an electrical short are provided in a common step with providing an electrical current through the shorted LEDs and through the corresponding fuses electrically connected in series to the shorted LEDs that renders the fuses non-conductive.

In another aspect, the disclosed technology includes a micro-transfer printable pixel component, including: an LED having first and second LED electrical contacts for providing power to the LED to cause the LED to emit light; a fuse having first and second fuse electrical contacts, the first fuse electrical contact electrically connected in series with the first LED electrical contact; a first electrode connected to the second fuse electrical contact; and a second electrode connected to the second LED electrical contact.

In certain embodiments, the micro-transfer printable pixel component includes first and second connection posts and wherein the first connection post is electrically connected to the first electrode or the second connection post is electrically connected to the second electrode.

In certain embodiments, the micro-transfer printable pixel component includes a plurality of LEDs, each LED of the plurality of LEDs having first and second LED electrical contacts for providing power to the LED to cause the LED to emit light, and a corresponding plurality of fuses, each fuse having first and second fuse electrical contacts, the first fuse electrical contact of each fuse electrically connected in series with the first LED electrical contact of a corresponding LED.

In certain embodiments, the micro-transfer printable pixel component includes a pixel substrate on which the LED, the fuse, the first electrode, and the second electrode are disposed.

In certain embodiments, the micro-transfer printable pixel component includes a pixel controller, the pixel controller electrically connected to any one or to any combination of the first LED electrical contact, the second LED electrical contact, the first fuse electrical contact, or the second fuse electrical contact.

In certain embodiments, the micro-transfer printable pixel component includes first and second connection posts and wherein the first connection post is electrically connected to the first electrode or the pixel controller or wherein the second connection post is electrically connected to the second electrode or the pixel controller.

In certain embodiments, the micro-transfer printable pixel component includes a redundant LED having first and second redundant LED electrical contacts for providing power to the redundant LED to cause the redundant LED to emit light; a redundant fuse having first and second redundant fuse electrical contacts, the first redundant fuse electrical contact electrically connected in series with the first redundant LED electrical contact; the first electrode connected to the second redundant fuse electrical contact; and the second electrode connected to the second redundant LED electrical contact.

In certain embodiments, the fuse is a distance greater than or equal to one times, 2 times, 3 times, 4 times, 5 times, 10 times, or 20 times the length or width of the LED from the LED.

In another aspect, the disclosed technology includes a method of making a micro-transfer printable pixel component, including: providing a pixel wafer having a patterned sacrificial layer forming an array of sacrificial portions separated by anchors; disposing an LED on the pixel wafer entirely in, on, or over a sacrificial portion, the LED having first and second LED electrical contacts for providing power to the LED to cause the LED to emit light; disposing a fuse having first and second fuse electrical contacts entirely in, on, or over the sacrificial portion; electrically connecting the first fuse electrical contact in series with the first LED electrical contact; providing a first electrode and electrically connecting the first electrode to the second fuse electrical contact; and providing a second electrode and electrically connecting the second electrode to the second LED electrical contact.

In certain embodiments, the method includes disposing the LED on or over the sacrificial portion by micro-transfer printing the LED on or over the sacrificial portion or disposing the fuse on or over the sacrificial portion by micro-transfer printing the fuse on or over the sacrificial portion.

In certain embodiments, the method includes disposing a redundant LED on the pixel wafer entirely in, on, or over the sacrificial portion, the redundant LED having first and second redundant LED electrical contacts for providing power to the redundant LED to cause the redundant LED to emit light; disposing a redundant fuse having first and second redundant fuse electrical contacts entirely in, on, or over the sacrificial portion; electrically connecting the first redundant fuse electrical contact in series with the first redundant LED electrical contact; electrically connecting the first electrode to the second redundant fuse electrical contact; and electrically connecting the second electrode to the second redundant LED electrical contact.

In another aspect, the disclosed technology includes a micro-transfer printable pixel component wafer, including: a pixel wafer having a patterned sacrificial layer forming an array of sacrificial portions separated by anchors; a plurality of pixel components, each pixel component disposed entirely on or over a corresponding sacrificial portion, wherein the plurality of pixel components comprises a redundant pixel component in parallel with a shorted pixel component.

In certain embodiments, the micro-transfer printable pixel component wafer includes first and second connection posts and wherein the first connection post is electrically connected to the first electrode or the second connection post is electrically connected to the second electrode.

In certain embodiments, the micro-transfer printable pixel component wafer includes a plurality of LEDs, each LED of the plurality of LEDs having first and second LED electrical contacts for providing power to the LED to cause the LED to emit light, and a corresponding plurality of fuses, each fuse having first and second fuse electrical contacts, the first fuse electrical contact of each fuse electrically connected in series with the first LED electrical contact of a corresponding LED.

In certain embodiments, the micro-transfer printable pixel component wafer includes a pixel substrate on which the LED, the fuse, the first electrical conductor, and the second electrical conductor are disposed.

In certain embodiments, the micro-transfer printable pixel component wafer includes a pixel controller, the pixel controller electrically connected to any one or to any combination of the first LED electrical contact, the second LED electrical contact, the first fuse electrical contact, or the second fuse electrical contact.

In another aspect, the disclosed technology includes a method of operating a display having fused light-emitting diodes (LEDs), including: providing a display, the display comprising a display substrate and an array of pixel components disposed on, over, or in the display substrate, each pixel component comprising a light-emitting diode and an electrical fuse electrically connected in series with the corresponding light-emitting diode; and providing an electrical current through one or more of the pixel components so that the fuse of any of the pixel components that has an LED with an electrical short is rendered non-conductive.

In certain embodiments, the micro-transfer printable pixel component wafer includes providing a forward-biased electrical current.

In certain embodiments, the micro-transfer printable pixel component wafer includes providing a reverse-biased electrical current.

In certain embodiments, the micro-transfer printable pixel component wafer includes sequentially providing an electrical current through each of the pixel components at a time, providing an electrical current through rows or columns of the pixel components at a time, or providing an electrical current through all of the pixel components at a time.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 9 and 10 are cross sections of display structures according to alternative embodiments of the present invention;

FIGS. 12-16 are flow charts illustrating methods of the present invention; and

DETAILED DESCRIPTION OF THE INVENTION

Figure 1:
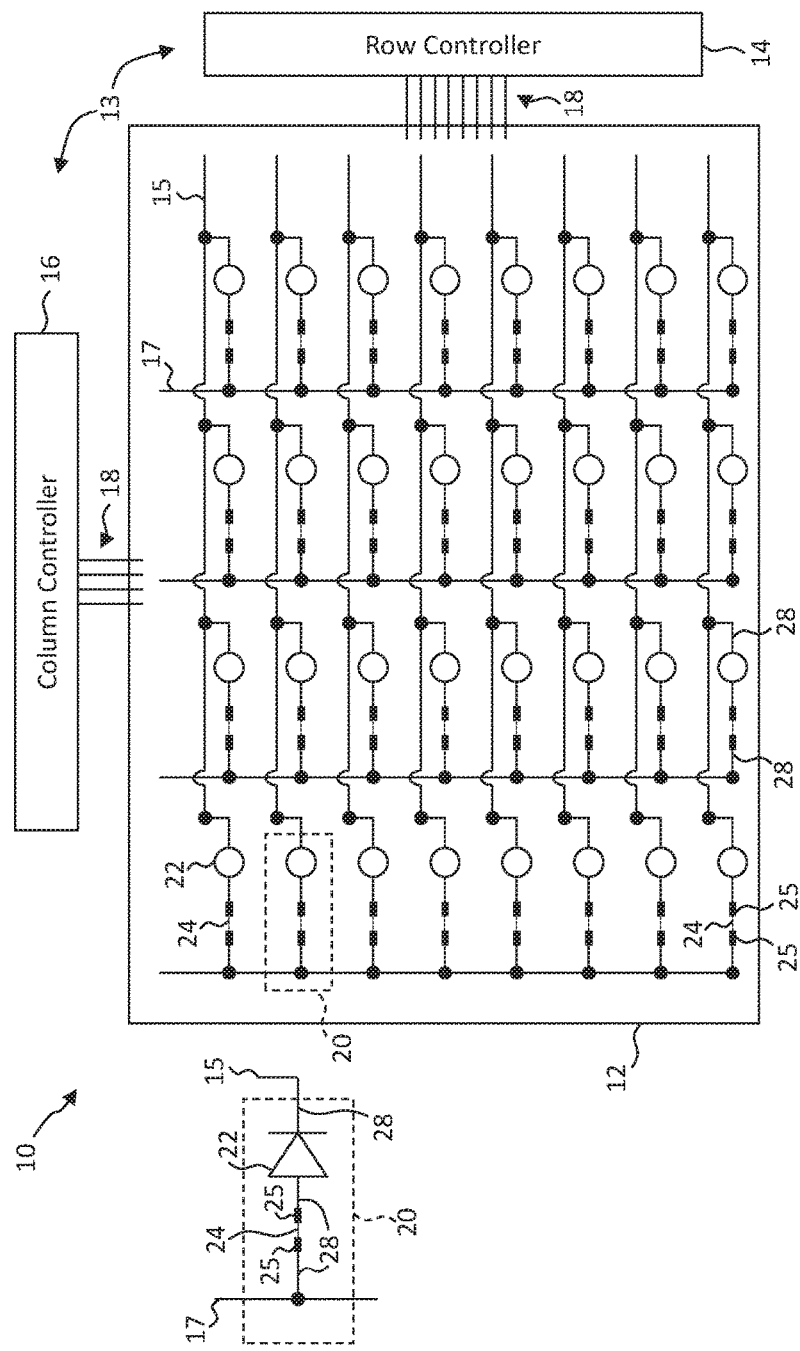
FIG. 1 is a schematic illustration of an embodiment of the present invention with an enlarged illustration.

The present invention includes embodiments of a display 10 having an array of fused light-emitting diodes (LEDs) 22, as illustrated in FIG. 1. The display 10 includes a display substrate 12 with an array of pixel components 20 disposed on, over, or in the display substrate 12. Each pixel component 20 has at least one light-emitting diode 22 and at least one electrical fuse 24. Each fuse 24 is electrically connected in series to at least one light-emitting diode 22, for example, with an electrode 28. Each fuse 24 can include fuse electrical contacts 25 for providing electrical connections to the fuse 24. The electrodes 28 can be or provide the fuse electrical contacts 25 or the fuse electrical contacts 25 can be or provide a portion of the electrodes 28. The electrodes 28 and the fuse electrical contacts 25 are electrical conductors and can be made of metal patterned with photolithographic methods, tools, and materials.

The display 10 can include an array of row conductors 15 formed on, in, or over the display substrate 12, the row conductors 15 extending in a row direction. An array of column conductors 17 are also formed on, in, or over the display substrate 12. The column conductors 17 extend in a column direction different from the row direction and and are not directly electrically connected to the row conductors 15 so that the row conductors 15 and the column conductors 17 can conduct different electrical signals at the same time. A pixel component 20 is electrically connected to each combination of the row conductors 15 and the column conductors 17 to form an array of the pixel components 20 disposed on or over the display substrate 12 that are matrix-addressed through the row and column conductors 15, 17 in a display 10. A column controller 16 and a row controller 14 provide signals to the column conductors 17 and the row conductors 15, respectively, through busses 18 to display images on the display 10. In various embodiments, the column conductors 17 and the row conductors 15 can also provide test signals to the pixel components 20 or can render the fuses 24 in the pixel components 20 non-conductive.

The display substrate 12 can be a glass, polymer, ceramic, or metal substrate having at least one side suitable for constructing the row and column conductors 15, 17 and receiving or forming the pixel components 20, or elements of the pixel components 20 such as the LEDs 22 and fuses 24, and electrodes 28 thereon. The display substrate 12 can have a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm and can be, but is not necessarily, transparent.

The light-emitting diodes 22 can be inorganic light-emitting diodes made in a semiconductor material, such as a compound semiconductor (e.g., GaN). The semiconductor material can be crystalline. Any one or each of the LEDs 22 or the fuses 24 can have a width from 2 to 5 μm, 5 to 10 μm, 10 to 20 μm, or 20 to 50 μm, has a length from 2 to 5 μm, 5 to 10 μm, 10 to 20 μm, or 20 to 50 μm, or has a height from 2 to 5 μm, 4 to 10 μm, 10 to 20 μm, or 20 to 50 μm.

The row and column conductors 15, 17 can be electrically conductive metal wires formed, or disposed on, the display substrate 12 using, for example, photolithographic methods, tools, and materials. The row and column controllers 14, 16 can be integrated circuits and provided external to the display substrate 12 or on the display substrate 12 and electrically connected using printed circuit board tools, methods, and materials.

The fuse 24 is an electrically conductive element that becomes permanently non-conductive when a pre-determined current passes through the fuse and is a type of sacrificial low-resistance resistor providing overcurrent protection. The essential component of the fuse 24 is a low-resistance electrical conductor that melts, oxidizes, vaporizes, sublimates, reacts, or otherwise loses conductivity when too much current flows through the fuse 24, referred to herein as melting although fuses 24 of the present invention are not limited to fuses 24 that melt. The fuse 24 can have a melting temperature that is greater than the maximum rated operating temperature of the LEDs 22 or the display 10. According to an embodiment of the present invention, the fuse 24 includes a metal wire or strip. As used herein, a fuse 24 that is rendered non-conductive is a blown fuse 24 and the process of rendering the fuse 24 non-conductive is the process of blowing the fuse 24. The current at which a fuse 24 is blown is its rated current or current rating. In an embodiment, the rated current is greater than or equal to 2 times, 5 times, 10 times, 20 times, 50 times, 100 times, 500 times, or 1000 times the maximum desired LED 22 current.

The electrical fuses 24 can be metal wires formed in a pre-determined shape and size, such as a shape and size providing a cross section designed to melt when conducting a desired current. The fuse 24 can be made, for example, of a metal such as zinc, copper, silver, aluminum, nickel, chrome, or tin, or metal alloys such as nickel-chromium that include these or other metals. In other embodiments, the fuses 24 can be made of most degenerate semiconductors that are highly doped and conduct current in a manner similar to a native metal. The fuses 24 can be made of or in a semiconductor and can be polysilicon. In an embodiment, the fuse 24 has a different cross section but is made of the same materials as the fuse electrical contacts 25, the electrodes 28, or the LED electrical contacts 23. The fuse 24 can have a cross section that is small or smaller than the cross section of other electrical conductors with which the fuse 24 is electrically connected in series, such as the electrodes 28, the LED electrical contacts 23, and the fuse electrical contacts 25. The fuse 24 can be a joint between two other electrical conductors. If the LED 22 is too conductive (i.e., shorted), for example if the LED 22 has an electrical short or short circuit (whether or not the LED 22 emits any light, too much light, too little light, or no light), the fuse 24 will cease to conduct any current at all. The term 'shorted' or 'short' refers to an electrical short circuit in a component, in this case an LED 22 in a pixel component 20. A pixel component 20 having a shorted LED 22 is referred to as a shorted pixel component 70, as discussed below.

Figure 2:
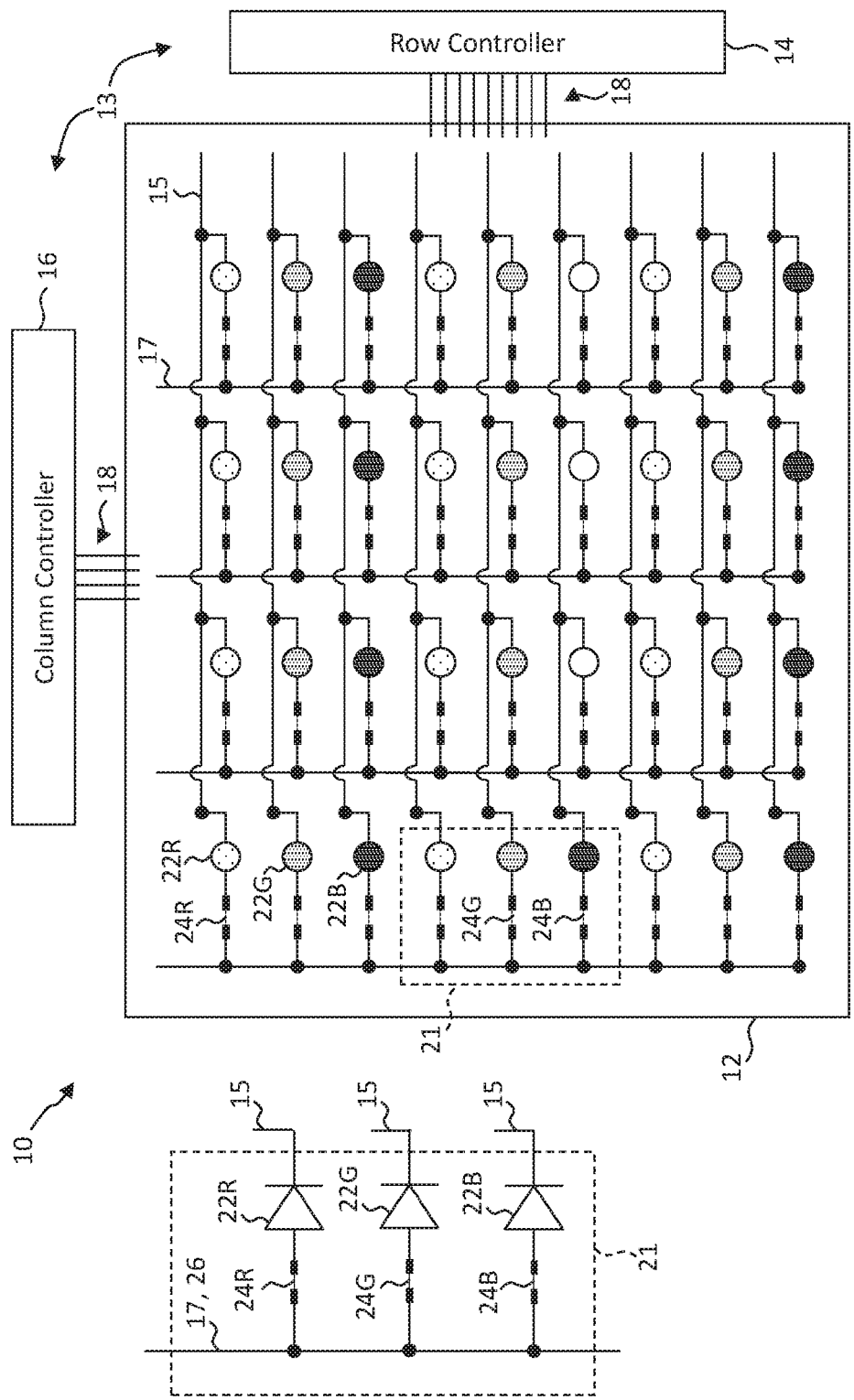
FIG. 2 is a schematic illustration of another embodiment of the present invention with an enlarged illustration.
Figure 5:
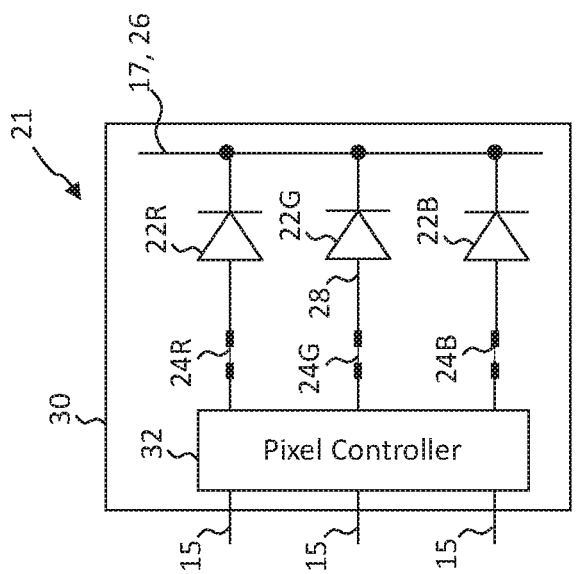

Referring to FIG. 2, in an embodiment one or more full-color pixel components 21 comprise a plurality of the LEDs 22, each LED 22 having a separate electrical fuse 24 electrically connected in series with the LED 22. As shown in FIG. 2, each of the full-color pixel components 21 includes a red LED 22R that emits red light, a green LED 22G that emits green light, and a blue LED 22B that emits blue light (collectively LEDs 22). A full-color pixel component 21 is also a pixel component 20. In an embodiment, the red, green, and blue LEDs 22R, 22G, 22B are electrically connected to a common electrical connection (as shown in FIG. 5, described below). Alternatively, the separate electrical fuses 24 are electrically connected to a common electrical connection 26 (as shown, column conductor 17, but in another embodiment row conductor 15). These connections can enable matrix-addressed control of the pixel components 20 through the row and column conductors 15, 17.

Furthermore, each of the differently colored red, green, and blue LEDs 22R, 22G, 22B can have a different optimal or maximum desired current. Thus, in an embodiment, the red LED 22R is electrically connected in series with a red electrical fuse (red fuse 24R), the green LED 22G is electrically connected in series with a green electrical fuse (green fuse 24G), and the blue LED 22B is electrically connected in series with a blue electrical fuse (blue fuse 24B), and at least one of the red, green, and blue fuses 24R, 24G, 24B is rendered non-conductive with a different amount of electrical power than another of the red, green, or blue fuses 24R, 24G, 24B. Thus, the fuses 24 can be customized to the particular LED 22 with which it is electrically in series.

Figure 3A:
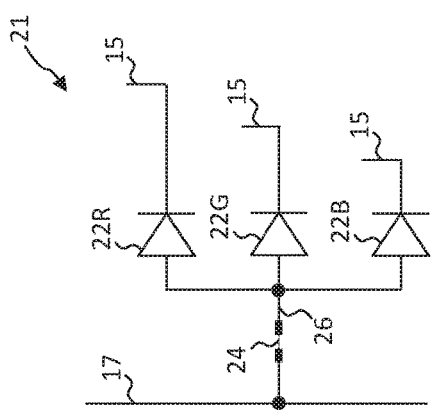
FIGS. 3A and 3B are schematic diagrams of a three-LED pixel circuit in parallel and serial configurations according to embodiments of the present invention.
Figure 3B:
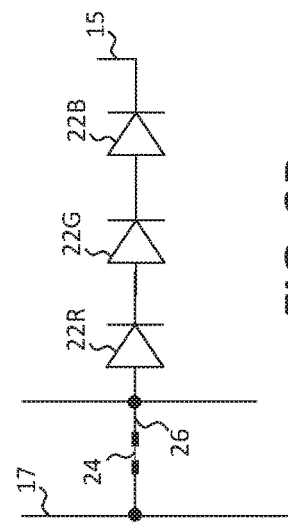

Referring to FIG. 3A, in another embodiment one or more of the pixel components 20 comprises a plurality of LEDs 22 electrically connected in parallel. In this embodiment, the plurality of LEDs 22 includes red, green, and blue LEDs 22R, 22G, 22B to form a full-color pixel component 21. An electrical fuse 24 is electrically connected in common with the common electrical connection 26 and electrically in series with each of the LEDs 22 in the plurality of LEDs 22. Referring to FIG. 3B, the plurality of LEDs 22 are electrically connected in series and form a monochrome pixel component 21. The electrical fuse 24 is electrically connected in common with the common electrical connection 26 and electrically in series with the series-connected LEDs 22. This reduces the number of fuses 24 that are necessary and still provides protection against electrically shorted LEDs 22.

In an embodiment, the row and column controllers 14, 16 control the LEDs 22 to display an image and also comprise a fuse controller 13 that provides image control signals that cause the array of LEDs 22 to display an image and fuse control signals that can provide sufficient electrical power to test the LEDs 22 or blow the fuses 24. In one embodiment, the fuse controller 13 provides electrical power to the LEDs 22 in a forward-biased direction. In another embodiment, the fuse controller 13 provides electrical power to the LEDs 22 in a reverse-biased direction. Providing current to the LEDs 22 and the fuses 24 in a forward-biased direction to blow the fuses 24 and display an image requires a simpler circuit than using a forward-biased current to display an image and a reverse-biased current to blow the fuses 24. However, a reverse-biased current can employ a larger voltage (but a voltage less than the breakdown voltage of the light-emitting diode), rendering the fuses 24 less sensitive to operating parameters. Thus, in this embodiment, the shorted LED 22 conducts a large reverse-biased current at a voltage less than the reverse breakdown voltage of the other non-shorted LEDs 22 in order to blow the fuse of the shorted LED 22 without damaging the non-shorted LEDs 22.

Figure 4:
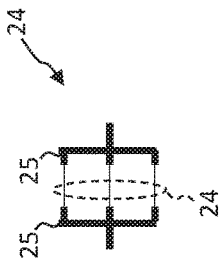
FIG. 4 is a schematic illustration of a three-wire fuse according to an embodiment of the present invention.

Referring to FIG. 4, in an embodiment one or more of the fuses 24 includes separate conductors connected in parallel. Such an arrangement can provide a more accurately controlled rated current.

Figure 6:
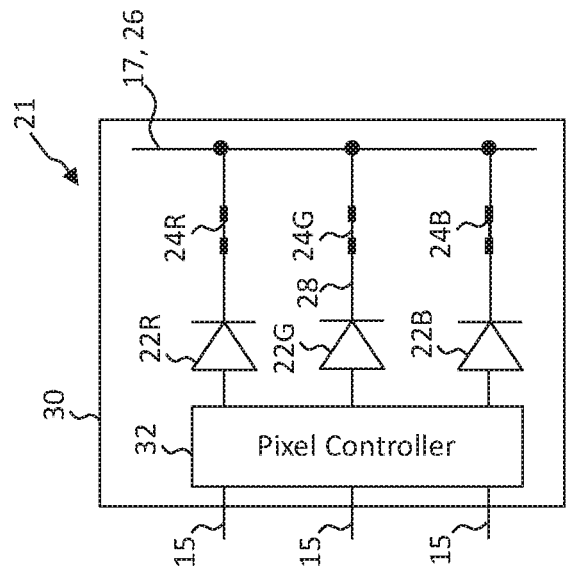
FIGS. 5 and 6 are schematic illustrations of active-matrix pixels according to an embodiment of the present invention.

In one embodiment of the present invention, the fuse controller 13 is a passive-matrix controller, as shown in FIG. 1. In another embodiment, referring to FIGS. 5 and 6, the fuse controller 13 (or row and column controllers 14, 16 together or individually) is an active-matrix controller and each pixel component 20 comprises a pixel controller 32 electrically connected to the LED(s) 22 and that can provide active-matrix pixel control to the LED(s) 22. The pixel controller 32 can also include circuitry that, in combination with the fuse controller 13 (or row and column controllers 14, 16 together or individually), provides sufficient electrical power to blow each fuse 24 and render it non-conductive. As shown in FIG. 5, a full-color pixel component 21 can include red, green, and blue LEDs 22R, 22G, 22B controlled by the pixel controller 32 and red, green, and blue fuses 24R, 24G, 24B connected in series with the red, green, and blue LEDs 22R, 22G, 22B between the pixel controller 32 and the red, green, and blue LEDs 22R, 22G, 22B. The red, green, and blue LEDs 22R, 22G, 22B are electrically connected in common to the column conductor 17. In the embodiment of FIG. 6, the red, green, and blue LEDs 22R, 22G, 22B are connected in series with the red, green, and blue fuses 24R, 24G, 24B between the pixel controller 32 and the red, green, and blue fuses 24R, 24G, 24B. The red, green, and blue fuses 24R, 24G, 24B are electrically connected in common to the column conductor 17. In both embodiments, the different row conductors 15 can be electrically connected to the pixel controller 32 to provide active-matrix control to the full-color pixel component 21. Alternatively, a row conductor 15 can be connected in common and different column conductors 17 can be electrically connected to the pixel controller 32 to provide active-matrix control. As will be understood by those knowledgeable in the art, 'row' and 'column' are arbitrary designations that can be exchanged in alternative embodiments of the present invention.

As shown in FIGS. 1 and 2, in an embodiment of the present invention, the LEDs 22 and the fuses 24 are disposed directly on a display substrate 12. In an alternative embodiment and as shown in FIGS. 5 and 6, the LEDs 22 and the fuses 24 are disposed on a pixel substrate 30 that is separate, independent, distinct from the display substrate 12. The pixel substrates 30 are then disposed on the display substrate 12. Use of pixel substrates 30 can provide a more modular display architecture that is more readily tested, repaired, or replaced.

Figure 7:
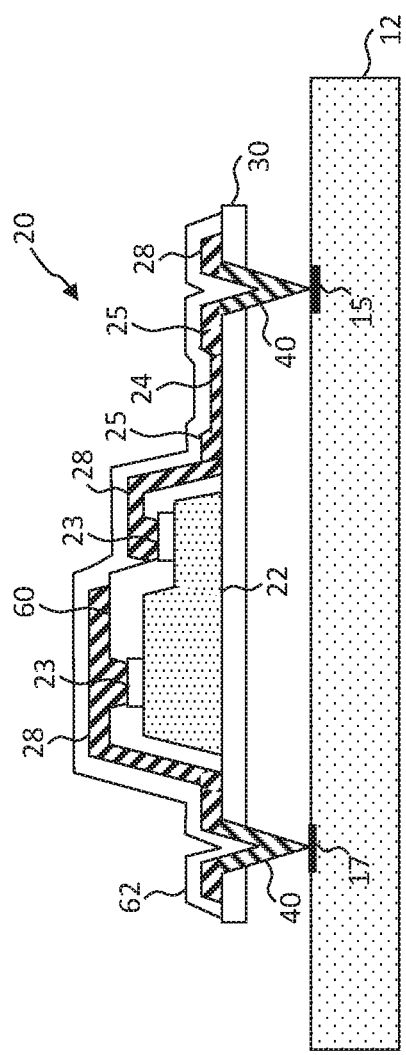
FIG. 7 is a cross section of a pixel component according to an embodiment of the present invention.
Figure 8:
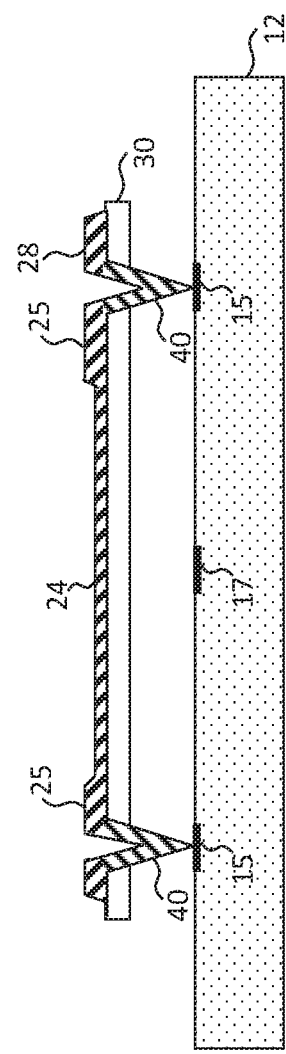
FIG. 8 is a cross section of a fuse structure according to an embodiment of the present invention.
Figure 25:
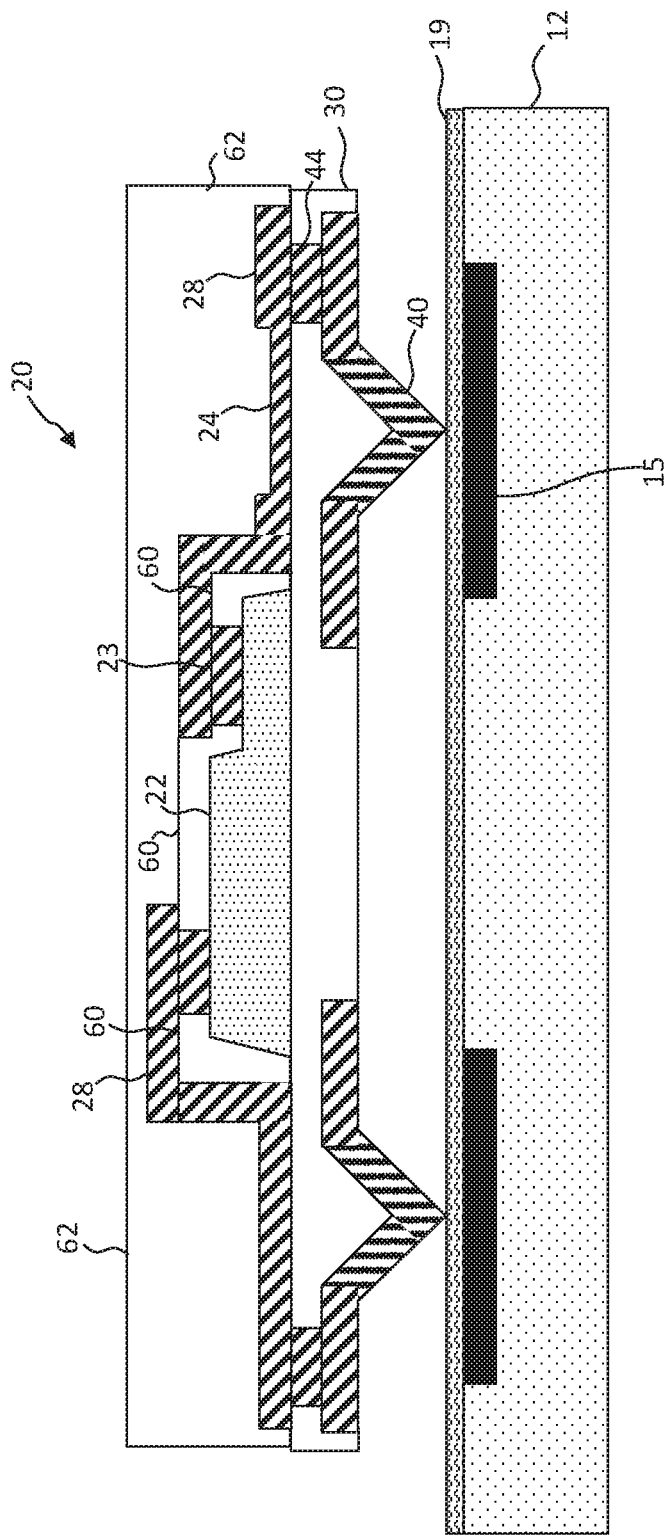
FIG. 25 is a cross section of a pixel component according to another embodiment of the present invention.

Referring to FIGS. 7 and 8, one or more of the fuses 24, the LEDs 22, the pixel controllers 32, or the pixel components 20 are provided in a micro-transfer printable component. As shown in FIG. 7, the LED 22 has LED electrical contacts 23 for providing electrical power to the LED 22 and cause the LED 22 to emit light. The LED electrical contacts 23 can be electrical contact pads or simply designated portions of the LED 22. Electrodes 28 are electrical conductors that electrically connect the LED electrical contacts 23 and LED 22 to the row and column conductors 15, 17 on the display substrate 12. Optionally, in an embodiment, the LED 22 has an underlying pixel substrate 30 and connection posts 40 that enable electrical connections between the electrodes 28 and the row or column conductors 15, 17 to be made during the micro-transfer printing process. As shown in the embodiment of FIG. 7, the fuse 24 can be incorporated in a common micro-transfer printable component with the LED 22 with fuse electrical contacts 25 electrically connected to the electrode 28. In a different embodiment, the LED 22 is provided in a micro-transfer printable component independent of and separate from the fuse 24. According to another embodiment of the present invention illustrated in FIG. 25, the underlying pixel substrate 30 includes vias 44 electrically connecting the electrodes 28 and the connection posts 40. An adhesive layer 19 can adhere the pixel component 20 to the display substrate 12. An encapsulation layer 62 can encapsulate the pixel components 20 of FIGS. 7 and 25.

As shown in another embodiment in FIG. 8, the fuse 24 is a micro-transfer printable component independent of the LED 22. In an optional embodiment, the fuse 24 has an underlying pixel substrate 30 and connection posts 40 that enable electrical connections with the row or column conductors 15, 17 to be made during a micro-transfer printing process. An encapsulation layer 62 can encapsulate the fuse 24 (not shown). In particular, in an embodiment, the fuse 24 can also serve as a jumper over the display substrate 12 connecting different row conductors 15 on opposite sides of a column conductor 17, as shown, or connecting different column conductors 17 on opposite sides of a row conductor 15, not shown. Micro-transfer printable LEDs 22, fuses 24, or pixel components 20 can be removable or replaceable. In another embodiment, the fuses 24 are formed separately from the LEDs 22 using photolithographic techniques, for example, made in a common step with electrodes 28 electrically connected to the connection posts 40.

As shown in the cross sections of FIGS. 7 and 9, with reference to the schematic illustrations of FIGS. 1 and 2, and as noted above, individual red, green, and blue light-emitting pixel components 20R, 20G, 20B can be disposed directly on the display substrate 12 using micro-transfer printing and connection posts 40 to provide electrical connections between the LEDs 22 and the row and column conductors 15, 17. Alternatively, referring to FIG. 10 and with reference to FIGS. 5, 6, and 7, a micro-transfer printable pixel component 20 (for example, a full-color pixel component 21) includes a pixel substrate 30 separate, independent, and distinct from the display substrate 12. One or more LEDs 22, each having first and second LED electrical contacts 23 (FIG. 7) for providing power to the LED 22 to cause the LED 22 to emit light are disposed on the pixel substrate 30. One or more fuses 24 each have first and second fuse electrical contacts 25. The first fuse electrical contact 25 is electrically connected in series with the first LED electrical contact 23, a first electrode 28 is electrically connected to the second fuse electrical contact 25, and a second electrode 28 is electrically connected to the second LED electrical contact 23. As shown in FIGS. 5 and 6, the pixel component 20 can be a full-color pixel component 21 and can comprise a plurality of LEDs 22, each LED 22 of the plurality of LEDs 22 having first and second LED electrical contacts 23 for providing power to the LED 22 to cause the LED 22 to emit light. A corresponding plurality of fuses 24 have first and second fuse electrical contacts 25, one of which is electrically connected in series with an LED electrical contact 23 of a corresponding LED 22. As shown in FIG. 10, the full-color pixel component 21 includes a plurality of different single-color pixel components 20, red pixel component 20R, green pixel component 20G, and blue pixel component 20B.

Figure 11:
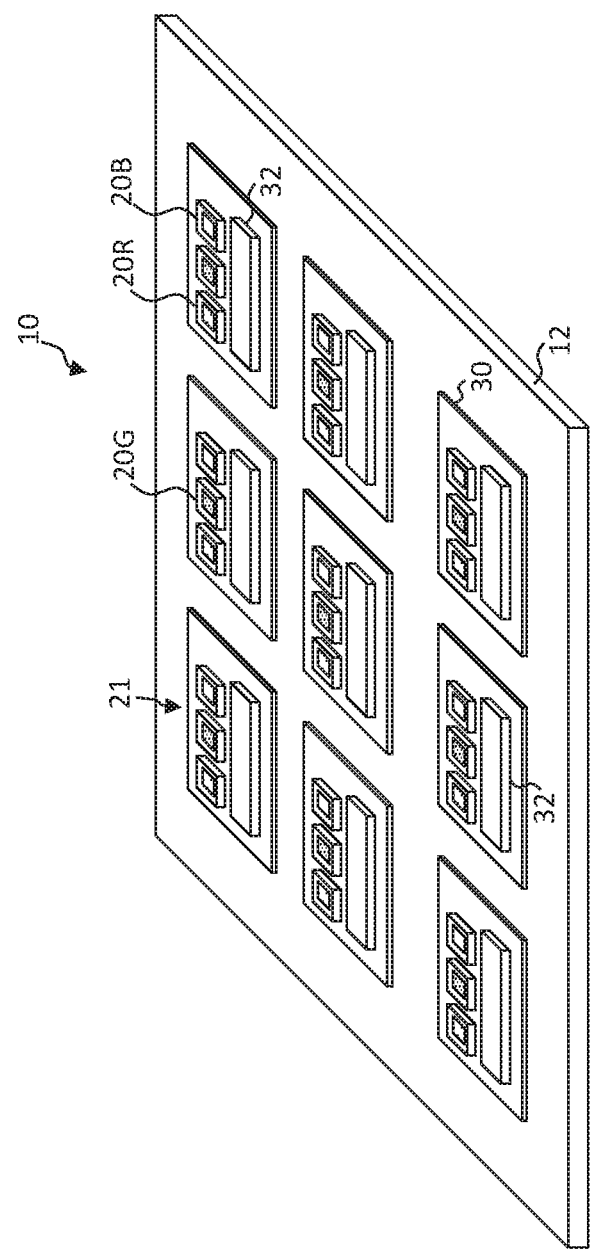
FIG. 11 is a perspective of a display according to an embodiment of the present invention.

In an embodiment, the micro-transfer printable pixel component 20 includes first and second connection posts 40. The first connection post 40 is electrically connected to the first electrode 28 or the second connection post 40 is electrically connected to the second electrode 28. Thus, in an embodiment, pixel components 20, LEDs 22, or fuses 24 can be micro-transfer printed onto the pixel substrate 30 to form a full-color pixel component 21 and the full-color pixel component 21 can itself be micro-transfer printed. The pixel component 20 can also include a pixel controller 32 that is electrically connected to any one or to any combination of the LED electrical contacts 23 or fuse electrical contacts 25. The connection posts 40 can be electrically connected to any one of or to any combination of the electrodes 28 or the pixel controller 32. FIG. 11 is a perspective of an array of full-color pixel components 21, each including red, green, and blue pixel components 20R, 20G, 20B micro-transfer printed on a pixel substrate 30 with a pixel controller 32. The full-color pixel components 21 are disposed on a display substrate 12 of a display 10.

Figure 17A:
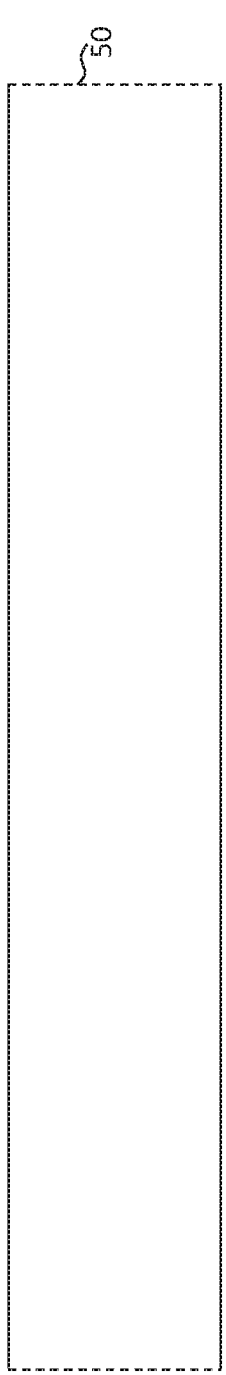
FIGS. 17A-17G are sequential cross sections illustrating steps in a method of making a micro-transfer printable pixel component and wafer according to embodiments of the present invention.
Figure 17B:
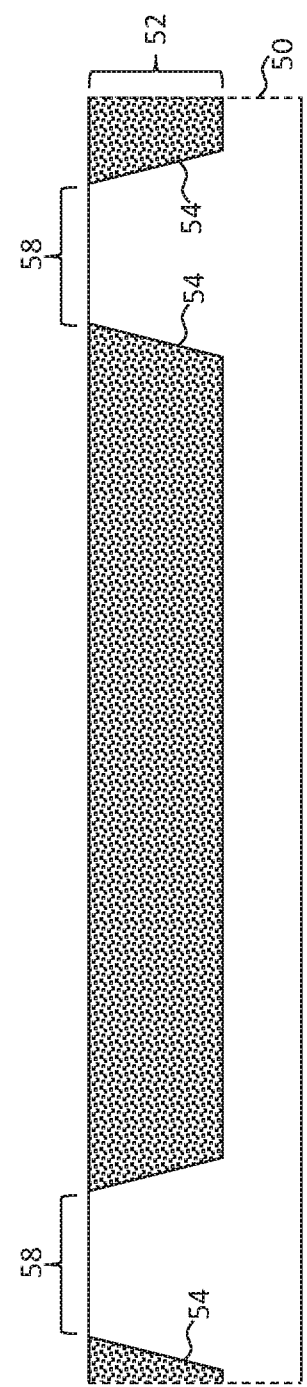
Figure 17C:
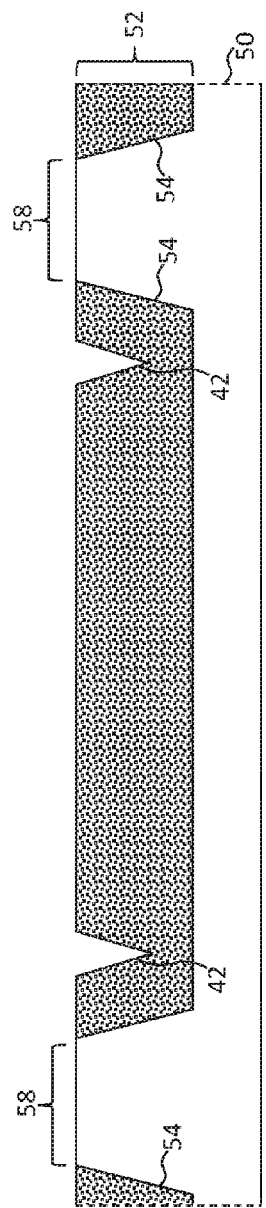
Figure 17D:
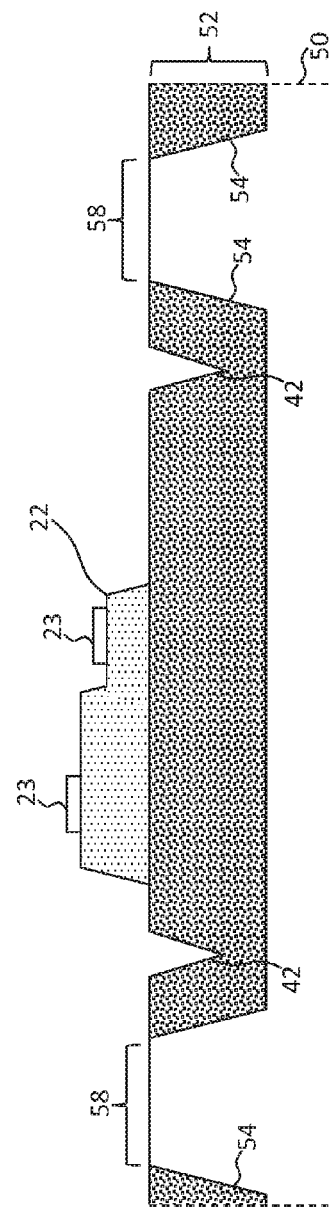

Referring to FIGS. 17A-17G, in a method of the present invention, a micro-transfer printable pixel component 20 and pixel component wafer is made by providing a pixel wafer 50 (FIG. 17A). A sacrificial layer 52 is patterned in, on, or over the pixel wafer 50 to form sacrificial portions 54 separated by portions of the pixel wafer 50 forming anchors 58 (FIG. 17B) using photolithographic materials and methods. The pixel wafer 50 can be a substrate such as a semiconductor, glass, polymer, metal, or ceramic wafer. Connection post forms 42 are etched into the sacrificial portions 54 (FIG. 17C). As shown in FIG. 17D, an LED 22 is provided by forming or disposing an LED 22 entirely on the sacrificial portion 54, for example, by micro-transfer printing the LED 22 from an LED source wafer onto the sacrificial portion 54. The LED 22 has first and second LED electrical contacts 23 for providing power to the LED 22 to cause the LED 22 to emit light. A patterned dielectric structure 60 is formed or otherwise disposed on the LED 22 to protect the LED 22 and LED electrical contacts 23. Electrical conductors, such as electrodes 28, are formed in electrical contact with the LED electrical contacts 23 over the sacrificial portion 54 and the connection post form 42 to form connection posts 40. The patterned dielectric structure 60 can be, for example, silicon dioxide and the electrical conducting electrodes 28 can be metal deposited and patterned using photolithographic materials, tools, and methods such as coating, sputtering, or evaporation, and etching with patterned photoresist.

Figure 17E:
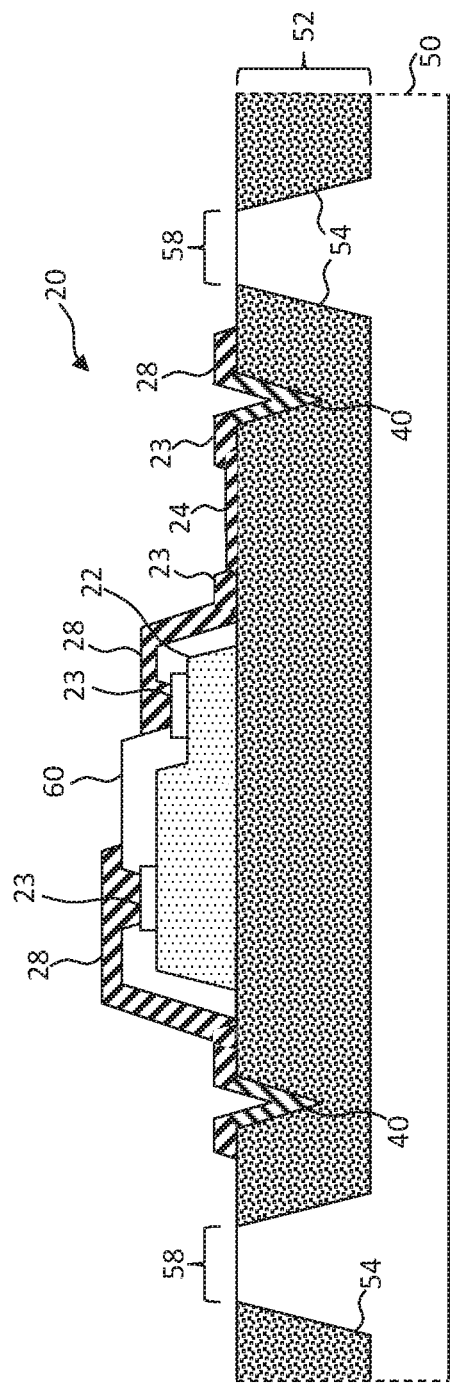

A fuse 24 having first and second fuse electrical contacts 25 is disposed entirely in, on, or over the sacrificial portion 54 (FIG. 17E). In one embodiment, the fuse 24 (or LED 22) is formed on the sacrificial portion 54 of the pixel wafer 50 using photolithographic processes and can be made, partially or entirely, in a common step with the electrodes 28 and using the same materials or including at least some of the same materials. Alternatively, the fuse 24 can be provided by micro-transfer printing the fuse 24 (FIG. 8) from a fuse source wafer. Either or both the LED 22 and fuse 24 can have connection posts 40 to enable electrical connections in, on, or over the pixel substrate 30 or otherwise in the pixel component 20. The first fuse electrical contact 25 is electrically connected in series with the first LED electrical contact 23, for example, using an electrode 28. A first electrode 28 is provided and electrically connected to the second fuse electrical contact 25 and a second electrode 28 is provided and electrically connected to the second LED electrical contact 23. In an embodiment, the electrodes 28 coat the connection post form 42 to make the connection posts 40.

Figure 17F:
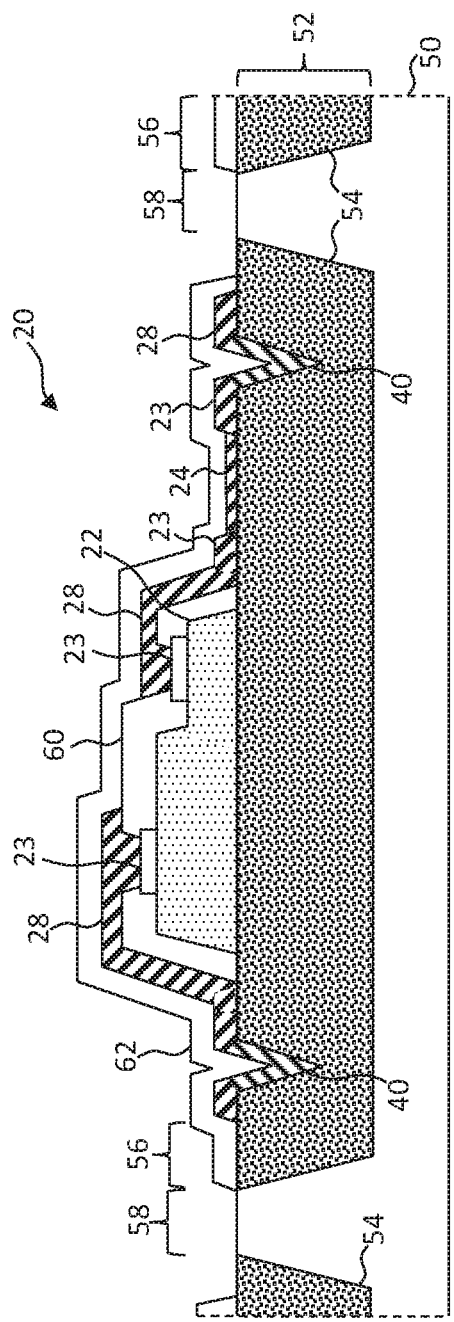

The electrodes 28, the fuse 24, and the first and second fuse electrical contacts 25 can be made in one step with common materials, or can be at least partially formed in a common step with some common materials using photolithography. For example, the fuse 24 can be made with a desired cross section together with a portion of the first and second fuse electrical contacts 25, electrodes 28, and connection posts 40. In a following step additional material can be provided to the first and second fuse electrical contacts 25, electrodes 28, and connection posts 40 to increase their cross section and electrical conductivity compared to the fuse 24. These elements form the pixel component 20 and are all shown in FIG. 17E. An optional encapsulation layer 62 is provided over the LED 22, electrodes 28, and fuse 24 (FIG. 17F).

The sacrificial portion 54 can be etched to form tethers 56 connecting the pixel component 20 to the anchor 58 and a gap between the pixel component 20 and the pixel wafer 50 (FIG. 17G), enabling the pixel component 20 to be micro-transfer printed with a transfer stamp. The sacrificial portions 54 can be, for example, an oxide layer or a designated anisotropically etchable portion of the pixel wafer 50, or, once etched, the gap between the pixel component 20 and the pixel wafer 50. In an embodiment, the optional encapsulation layer 62 is patterned (as shown) and can include an oxide or nitride such as silicon nitride and can form at least a portion of the tether 56.

In another embodiment, a plurality of LEDs 22 and fuses 24 are formed or disposed entirely over a common sacrificial portion 54. Optionally, a pixel controller 32 is also disposed entirely on the common sacrificial portion 54, for example by micro-transfer printing, to make the full-color pixel component 21 structure of FIG. 5, 6, 10, or 11. The pixel wafer 50 can include a plurality of sacrificial portions 54 and corresponding plurality of pixel components 20 disposed on the sacrificial portions 54, each pixel component 20 having one or more LEDs 22, one or more fuses 24 electrically connected in series with a corresponding LED 22, and optionally first and second connection posts 40 for making electrical connections to the pixel components 20.

Figure 17G:
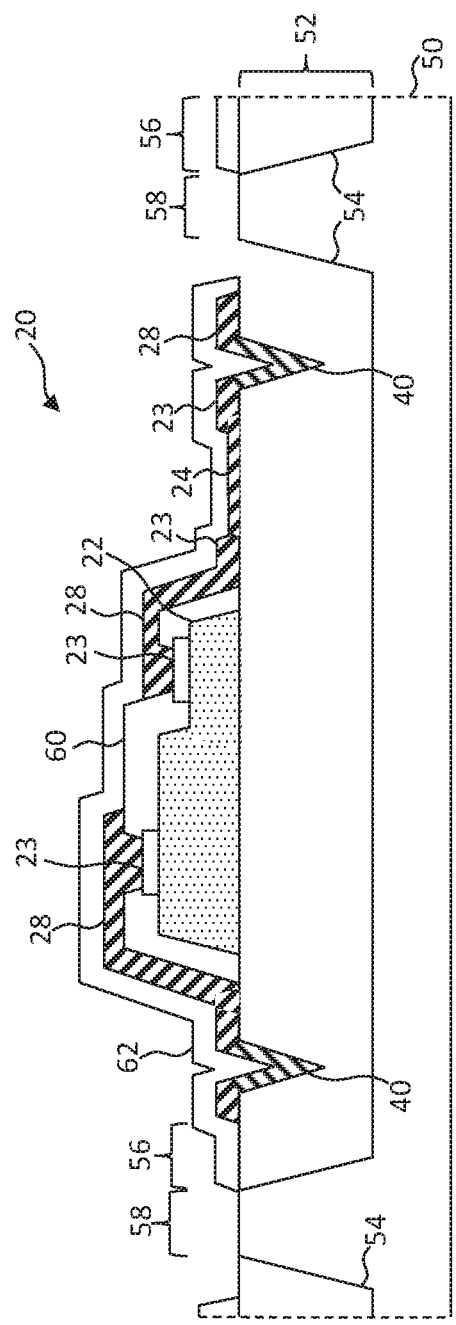
Figure 18A:
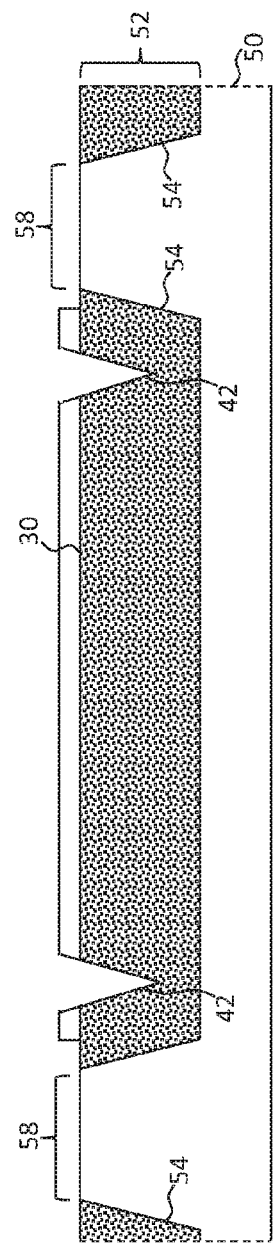
FIGS. 18A and 18B are cross sections illustrating pixel components with pixel substrates according to embodiments of the present invention.
Figure 18B:
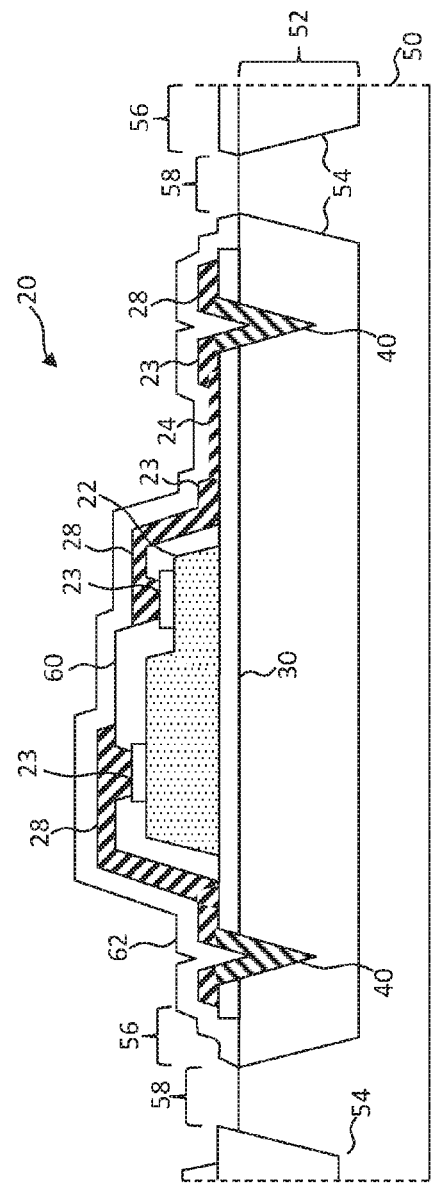

In one embodiment, the micro-transfer printable pixel component 20 is then transfer printed to the display substrate 12 to form the structures illustrated in FIG. 1, 2, or 9. The encapsulation layer 62 and the electrodes 28 can provide sufficient mechanical and structural rigidity to the pixel component 20 that the pixel component 20 can be micro-transfer printed without additional support. In an embodiment and as shown in FIG. 17G, the sacrificial layer 52 provides a surface with sufficient mechanical rigidity to enable LEDs 22, fuses 24, or pixel controllers 32 to be micro-transfer printed thereon and electrodes 28 formed using photolithographic processes. The electrodes 28 and encapsulation layer 62 provide enough mechanical structure and rigidity to enable micro-transfer printing the pixel component 20 from the pixel wafer 50. Alternatively, an optional pixel substrate 30 can be provided on which LEDs 22, fuses 24, pixel controllers 32, or electrodes 28 can be disposed, micro-transfer printed, or otherwise formed. Referring to FIG. 18A, a pixel substrate 30, for example an oxide or nitride layer such as a silicon dioxide layer can be formed on or over the sacrificial portions 54, for example, after the steps illustrated in FIG. 17C or 17D, using photo-lithographic processes, tools, and materials. FIG. 18B illustrates a released pixel component 20 having the pixel substrate 30 (corresponding to FIG. 17G).

Figure 19:
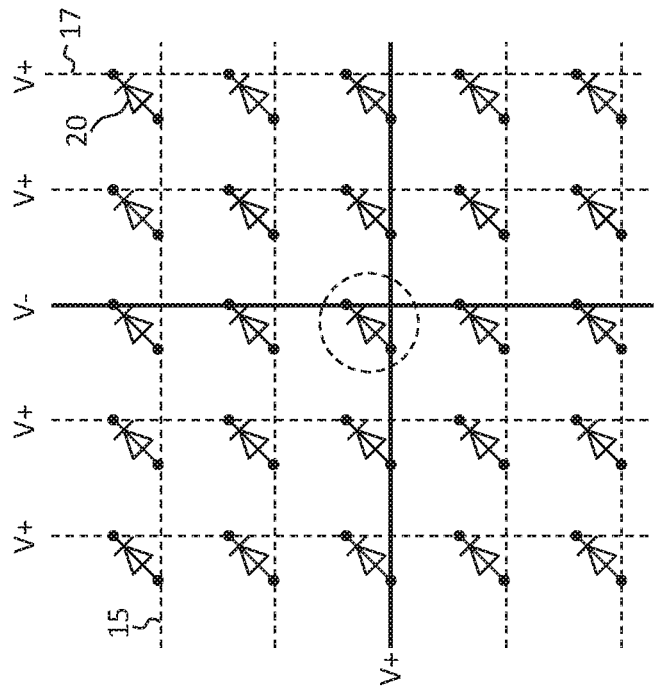

Referring to FIG. 19, an array of the pixel components 20 are illustrated with matrix-addressed row and column conductors 15, 17, controlled by the row and column controllers 14, 16, respectively (not shown), corresponding to FIG. 1. (In FIGS. 19 and 20, the fuses 24 are not illustrated for clarity.) The dashed row or column conductors 15, 17 are not provided with a forward-biased voltage differential while the center row and column conductors 15, 17 are shown with a thicker, solid line to illustrate that they are provided with a forward-biased voltage differential. In normal operation with functional pixel components 20, the center pixel component 20 (indicated with a dashed circle) will conduct current from the center row conductor 15 to the center column conductor 17 and emit light. The remaining pixel components 20 in the center column do not emit light because there is no voltage difference with the corresponding row conductor 15. The other pixel components 20 in the center row and connected to the other columns do not emit light because they are reverse biased.

Figure 20:
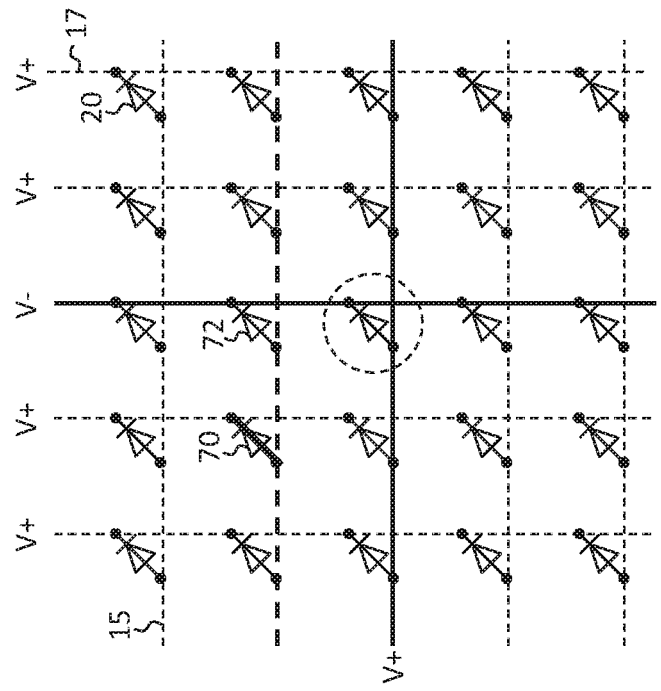
FIGS. 19 and 20 are circuit diagrams illustrating the operation of the present invention according to embodiments of the present invention.

Referring to FIG. 20, however, if a pixel component 20 is shorted to form a shorted pixel component 70, the row in which the shorted pixel component 70 is electrically connected will be provided with power from the corresponding column conductor 17 through the shorted pixel component 70. The pixel component 72 in the center column and the row with the shorted pixel component 70 will therefore also emit light. If all of the column conductors 17 except that of the shorted pixel component 70 are powered to emit light from all of the pixel components 20 in the center row, then all of the pixel components 20 in the row that includes the shorted pixel component 70 will emit light (except the shorted pixel component 70). Thus, shorted pixel components 70 can cause other, functional pixel components 20 to emit light and render the display 10 unusable. A row having a shorted pixel component 70 has been demonstrated to undesirably cause the remaining pixels in the row to emit light and the removal of a conductor in series with the shorted pixel component 70 (electrically equivalent to blowing a fuse 24) has been demonstrated to prevent the undesirable light emission.

According to embodiments of the present invention, this electrically shorted LEDs in a display 10 can be mitigated by blowing the fuse 24 of the shorted pixel component 70 having the shorted LED. This can be accomplished in a variety of ways. In one method of the present invention, referring to FIG. 12, the display is provided in step 100 and operated in step 110 so that the pixel components 20 emit light. An operational parameter of each pixel component 20 is measured in step 120 (for example light output or current through each pixel component 20). The shorted pixel components 70 are determined in step 130 and the fuses 24 of the shorted pixel components 70 are blown in step 140.

Referring to FIG. 13, shorted pixel components 70 can be determined by measuring the light output of each pixel component 20 (step 122) and comparing it to an expected light output (step 124). Shorted pixel components 70 typically do not emit light and they can be distinguished from open pixel components 20 (pixel components 20 that do not conduct current and do not emit light), by controlling the pixel components 20 in a common row or column with the non-light-emitting pixel component 20 as described above with respect to FIG. 20. Referring to FIG. 14, shorted pixel components 70 can also be determined by measuring (step 126) the current through each LED 22 individually and comparing the measured current to an expected standard (step 128). Shorted pixel components 70 can conduct more current than functional pixel components 20, for example when provided with a voltage difference that is less than the expected voltage drop for the LED 22, when provided with a reverse-biased voltage differential, or by noting a greater-than-expected current when driven with a predetermined operating voltage. In another embodiment, a shorted pixel component 70 is determined by passing a current through the shorted pixel component 70 and measuring the voltage across the shorted pixel component 70. An electrical short can be measured as a very low voltage drop in comparison with a good pixel component 20, which can have a voltage drop exceeding two volts. For example, an electrical short can be measured as a voltage drop across the power supply lines (power and ground lines) of a shorted pixel component 70 of less than two volts, less than 1.5 volts, less than 1.0 volts, less than 0.5 volts, or less than 0.25 volts.

The fuses 24 of the shorted pixel components 70 can be blown by providing a reverse-biased current across the shorted pixel components 70 with a voltage that is greater than the normal operating voltage but less than the breakdown voltage of the LEDs 22, to avoid destroying functional pixel components 20. Alternatively, as noted above with respect to FIG. 20, a shorted pixel component 70 can conduct enough current to drive a row of functional pixel components 20. By setting the fuse 24 current rating at a current level greater than the current necessary to operate a single functional pixel component 20 but less than the current necessary to operate multiple pixel components 20, the fuse 24 of a shorted pixel component 70 can be blown by controlling the row to emit light from all of the other pixel components 20 in the row.

The display 10 can be operated in various ways to determine any shorted pixel components 70. In one way, each LED 22 is sequentially operated and its operating characteristics measured. In another way, all of the LEDs 22 in a row or a column are operated at a time and the rows or columns sequentially operated. In yet another way, all of the LEDs 22 are operated at the same time.

Similarly, the fuses 24 of shorted pixel components 70 can be blown in different ways. In one way, each fuse 24 of the shorted pixel components 70 is sequentially blown. In another way, all of the fuses 24 of the shorted pixel components 70 in a row or a column are blown at a time and the rows or columns sequentially activated. In yet another way, all of the fuses 24 of the shorted pixel components 70 are blown at the same time. For example, by providing all of the pixel components 20 in the display (sequentially, in rows or columns, or all at once) with a reverse-biased voltage and enough current to blow the fuses 24, all of the fuses 24 can be blown one after the other, in rows or columns at a time, or all at once. (Fuses 24 can be blown by using either or both passive-matrix control or active-matrix control.) In another example, by operating all of the pixel components 20 in a row or column at a time, a forward-biased low-resistance shorted pixel component 70 will conduct more current than the normally functional pixel components 20 in a common row or column and will blow the fuse 24 of the shorted pixel component 70.

In an embodiment of the present invention, the step 140 of blowing a fuse 24 is a common step with measuring the operational parameter in step 120 and determining the shorted LEDs 22 (shorted pixel components 70) in step 130, and can even be the same step 110 as operating the display 10. By providing a fuse 24 with a predetermined current rating and providing an image or fuse signal to the pixel components 20 with sufficient current to blow the fuse 24 of a shorted pixel component 70 and leave the functional pixel components 20 operational the current is inherently compared to the rated current (step 120) and if the fuse 24 of a shorted pixel component 70 is blown, the blown fuses 24 determine the shorted LEDs 22 of the electrically shorted pixel components 70. Hence, in an embodiment, the display 10 is rendered properly functional by providing the display in step 110 according to embodiments of the present invention, and then providing a fuse signal that deactivates any shorted pixel components 70 the display by blowing its associated fuse 24 in step 102 and leaving the remaining pixel components 20 functional.

Figure 24:
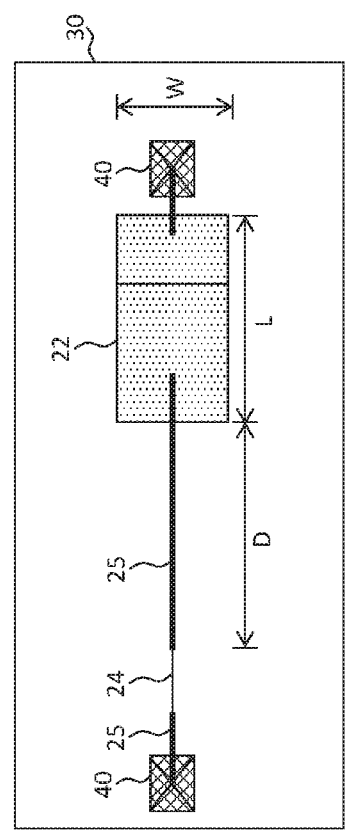
FIG. 24 is a schematic illustrating the spatial location of a fuse with respect to an LED in a pixel component according to an embodiment of the present invention.

The current rating of a fuse 24 can depend, at least in part, on the temperature of the fuse 24. Since an operational LED 22 can have an elevated temperature, the associated fuse 24 can also have an elevated temperature that affects its current rating. Hence, referring to FIG. 24, the spatial location of the fuse 24 with respect to its corresponding LED 22 can be selected to reduce changes in the fuse 24 current rating due to temperature changes in the LED 22. As shown in FIG. 24, a fuse 24 is located a distance D from its associated LED 22. The associated LED 22 has a length L and width W over the display substrate 12 (FIG. 1). In an embodiment, the distance D is greater than or equal to the length L or width W. In other embodiments, the distance D is greater than or equal to 1.5 times, 2 times, 3 times, 4 times, 5 times, 10 times, or 20 times the length L or width W. The rated current of the fuse 24 can be set to compensate for the operating temperature of the LED 22, pixel component 20, or display 10.

Figure 16:
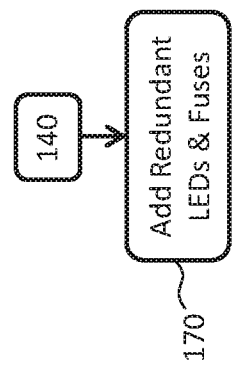
Figure 15:
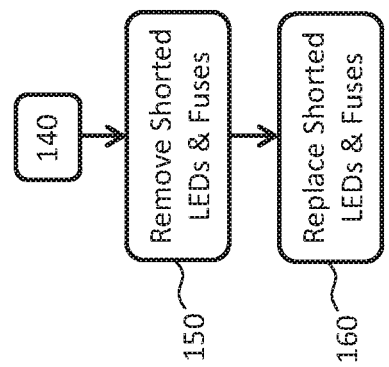
Figure 21:
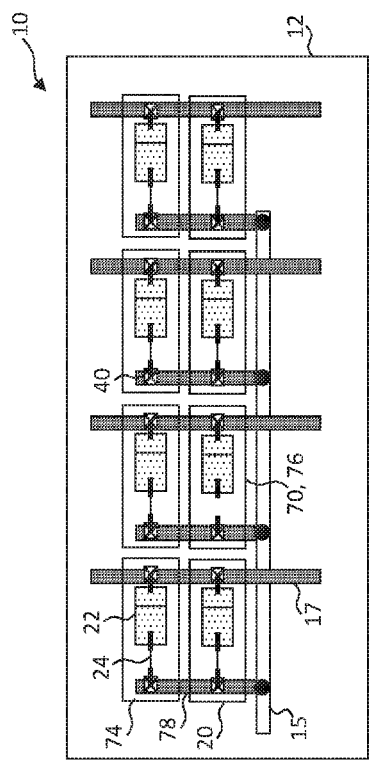
FIGS. 21-23 are schematic drawings illustrating redundant elements according to embodiments of the present invention.

Once the fuse 24 of a shorted pixel component 70 is blown, the shorted pixel component 70 cannot conduct current and therefore cannot emit light, if it ever did. Consequently, the display 10 will have a missing pixel. This can be corrected, referring to FIG. 15, by removing the shorted LED 22 and fuse 24 (for example, in a pixel component 20 such as is illustrated in FIG. 7) in step 150. The removed shorted pixel component 70 can be replaced with a new pixel component 20 in step 160. The shorted pixel component 70 can be manually removed and a new pixel component 20 can be micro-transfer printed into place and electrically connected, either using connection posts 40 or with photolithographic methods. Alternatively, referring to FIGS. 16 and 23, a redundant LED 22E and fuse 24E (for example, in a common pixel component 20) can be added in step 170. The redundant pixel component 74 can be added after the shorted pixel component 70 is removed or before. Hence, in an embodiment and as shown in FIGS. 21 and 22, a redundant pixel component 74 can be provided for each pixel component 20 and electrically connected in parallel with the corresponding pixel component 20 as part of the display 10 manufacturing process and before the display 10 is tested.

If an LED 22 is electrically open, a redundant pixel component 74 can provide the needed light output. If the LED 22 is electrically shorted, the fuse 24 of the shorted pixel component 70 is blown providing a blown pixel component 76 and the redundant pixel component 74 provides the needed light output. Therefore, as shown in FIG. 21, the display 10 includes a redundant pixel component 74 at each juncture of a row conductor 15 and column conductor 17 pixel component 20 site. The fuses 24 of the shorted pixel components 70 are blown and the redundant pixel components 74 are operated to provide the needed pixel emission. If both the pixel component 20 and the redundant pixel component 74 are functional, they are both operated together to provide the desired light output together (for example, by driving each pixel component 20 and redundant pixel component 74 at half the desired brightness). If the redundant pixel component 74 is a shorted pixel component 70, the redundant fuse 24 of the redundant pixel component 74 can be blown as described above with respect to the pixel components 20.

The row conductors 15 can include an electrically conductive conductor extension 78 to provide a space over the display substrate 12 in which the redundant pixel components 74 can be disposed and electrically connected to the row and column conductors 15, 17. The conductor extension 78 can be an electrical conductor (for example, made of metal or the same material used for the row or column conductors 15, 17 and made in the same step or using similar photolithographic processes), that is electrically connected to the row conductor 15 and is substantially parallel to the column conductor 17. As shown in FIG. 22, multiple conductor extensions 78 can be provided and can be substantially parallel to either the row conductor 15 or column conductor 17. The redundant pixel component 74 can be provided and electrically connected in similar or the same steps as the pixel component 20 is provided and electrically connected.

Figure 22:
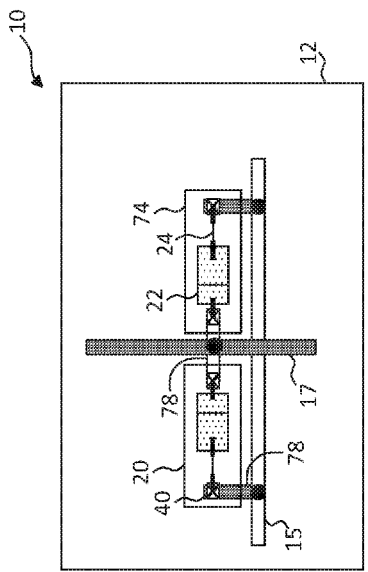

As will be apparent to those skilled in the art of substrate and component layout, alternative arrangements of the pixel components 20 and redundant pixel components 74 are possible, for example as illustrated in FIG. 22.

Figure 23:
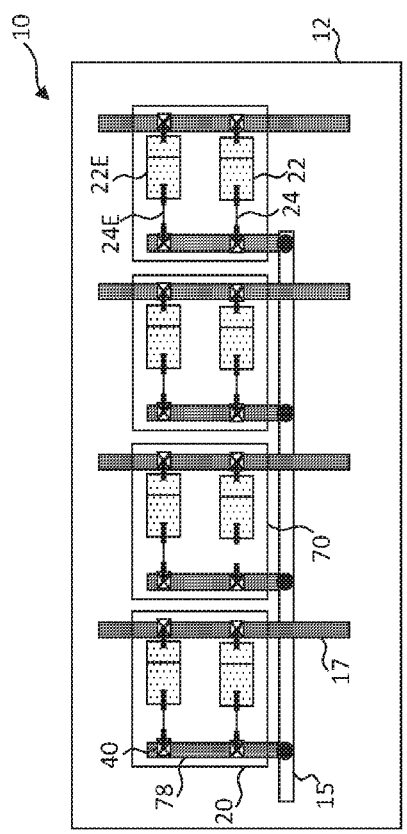

In an alternative embodiment and referring to FIG. 23, each pixel component 20 includes a redundant LED 22E and associated redundant fuse 24E electrically connected in series with the redundant LED 22E. The redundant LED 22E and redundant fuse 24E are electrically connected in parallel with the LED 22 and fuse 24. Thus a micro-transfer printable pixel component 20 of the present invention comprises a redundant LED 22E having first and second redundant LED electrical contacts 23 for providing power to the redundant LED 22E to cause the redundant LED 22E to emit light. A redundant fuse 24E has first and second redundant fuse electrical contacts 25. The first redundant fuse electrical contact 25 is electrically connected in series with the first redundant LED electrical contact 23. The first electrode 28 is connected to the second redundant fuse electrical contact 25 and the second electrode 28 is connected to the second redundant LED electrical contact 23. The redundant LED 22E and redundant fuse 24E can be provided and electrically connected in similar or the same steps as the LED 22 and fuse 24 are provided and electrically connected.

Thus, methods and structures of the present invention can enable fully functional LED displays such as displays incorporating matrix-addressed arrays of inorganic LEDs.

In some embodiments of the present invention, the LEDs 22, fuses 24, or pixel components 20 (collectively referred to below as elements) have a thin substrate with a thickness of only a few microns, for example less than or equal to 25 microns, less than or equal to 15 microns, or less than or equal to 10 microns, and a width or length of 5-10 microns, 10-50 microns, 50-100 microns, or 100-1000 microns. Such micro-transfer printable elements can be made in a semiconductor source wafer (e.g., a silicon or GaN wafer) having a process side and a back side used to handle and transport the wafer. The elements are formed using lithographic processes in an active layer on or in the process side of a source wafer. An empty release layer space (corresponding to sacrificial portion 54 in FIG. 17G or 18B) is formed beneath the micro-transfer printable elements with tethers 56 connecting the micro-transfer printable elements to the source wafer (e.g., pixel wafer 50, LED source wafer, or fuse source wafer) in such a way that pressure applied against the micro-transfer printable elements with a transfer stamp breaks the tethers 56 to release the micro-transfer printable elements from the source wafer. The elements are then micro-transfer printed to a destination substrate such as a pixel wafer 50 or display substrate 12. Lithographic processes in the integrated circuit art for forming micro-transfer printable elements in a source wafer, for example transistors, LEDS, wires, and capacitors, can be used. The same etching and transfer process can be used to micro-transfer print the assembled or constructed elements onto the pixel wafer 50 or display substrate 12.

Methods of forming such micro-transfer printable structures are described, for example, in the paper *AMOLED Displays using Transfer-Printed Integrated Circuits* and U.S. Pat. No. 8,889,485, referenced above. For a discussion of micro-transfer printing techniques see, U.S. Pat. Nos. 8,722,458, 7,622,367 and 8,506,867, each of which is hereby incorporated by reference in its entirety. Micro-transfer printing using compound micro-assembly structures and methods can also be used with the present invention, for example, as described in U.S. patent application Ser. No. 14/822,868, filed Aug. 10, 2015, entitled Compound Micro-Assembly Strategies and Devices, which is hereby incorporated by reference in its entirety. In an embodiment, the pixel component 20 is a compound micro-assembled device.

According to various embodiments of the present invention, the pixel wafer 50 can be provided with the LEDs 22, release layer (sacrificial layer 52), tethers 56, and connection posts 40 already formed, or they can be constructed as part of the process of the present invention. Similarly, any source wafers having micro-transfer printable LEDs 22 thereon can be constructed or transfer printed as part of the process of the present invention.

Connection posts 40 are electrical connections formed on a side of a micro-transfer printable element such as the LED 22, fuse 24, or pixel component 20 that extend generally perpendicular to a surface of the element. Such connection posts 40 can be formed from metals such as aluminum, titanium, tungsten, copper, silver, gold, or other conductive metals. In some embodiments, the connection posts 40 are made of one or more high elastic modulus metals, such as tungsten. As used herein, a high elastic modulus is an elastic modulus sufficient to maintain the function and structure of the connection posts 40 when pressed into a display substrate 12 row conductors 15 or column conductors 17 (which can include electrical contact pads as discussed below).

The connection posts 40 can be formed by repeated masking and deposition processes that build up three-dimensional structures, for example, by etching one or more layers of metal evaporated or sputtered on the process side of the element. Such structures can also be made by forming a layer above the element surface (e.g., sacrificial layer 52), etching a well into the surface to form a connection post form 42, filling or covering it with a patterned conductive material such as metal, and then removing the layer. The connection posts 40 can have a variety of aspect ratios and typically have a peak area smaller than a base area. The connection posts 40 can have a sharp point for embedding in or piercing electrical contact pads electrically connected to the row conductors 15 or column conductors 17, electrodes 28, or fuse electrical contacts 25. The connection posts 40 can include a post material coated with an electrically conductive material different from the post material. The post material can be an electrically conductive metal or a doped or undoped semiconductor or an electrically insulating polymer, for example a resin, cured, resin, or epoxy and can have any of a variety of hardness or elastic modulus values. In an embodiment, the post material is softer than the conductive material so that the conductive material can crumple when the connection post 40 is under mechanical pressure. Alternatively, the conductive material is softer than the post material so that it deforms before the post material when under mechanical pressure. By deform is meant that the connection posts 40, the contact pads, or the conductive material change shape as a consequence of the transfer printing. The connection post 40 or post material can be a semiconductor material, such as silicon or GaN, formed by etching material from around the connection post 40. Coatings, such as the conductive material can be evaporated or sputtered over the post material structure and then patternwise etched to form the connection post 40. The conductive material can be a solder or other metal or metal alloy that flows under a relatively low temperature, for example less than 120 degrees C. In particular, the conductive material can have a melting point less than the melting point of the post material.

In certain embodiments, the two or more adjacent connection posts 40 comprise a first and a second connection post 40 of different heights. In certain embodiments, the distance between two or more connection posts 40 is less than a width or length of the contact pads in a direction parallel to the display substrate 12. In certain embodiments, the connection posts 40 are disposed in groups, the connection posts 40 within a group are electrically connected to a common contact pad and the connection posts 40 in different groups are electrically connected to different contact pads. In certain embodiments, the connection posts 40 are disposed in groups and a spacing between adjacent connection posts 40 within a given group is less than a spacing between adjacent groups. In certain embodiments, the connection posts 40 within a group are electrically shorted together. In certain embodiments, each of the two or more connection posts 40 is a multi-layer connection post 40. In certain embodiments, the contact pads comprise a material that is the same material as a material included in the connection post 40.

In certain embodiments, the contact pads comprise a material that is softer than that of the connection post 40. In certain embodiments, the connection posts 40 comprise a material that is softer than that of the contact pads. In certain embodiments, a conductive material other than a material of the contact pad or the connection post 40 adheres or electrically connects, or both, the contact pad to the connection post 40. In certain embodiments, at least a portion of the contact pad has a first conductive layer and a second conductive layer over the first conductive layer, and the second conductive layer has a lower melting temperature than the first conductive layer. In embodiments, the contact pad is coated with a non-conductive layer or the contact pad is formed on a compliant non-conductive layer. In certain embodiments, the second conductive layer is a solder. In certain embodiments, the contact pad is welded to the connection post 40. In certain embodiments, the contact pads are non-planar and the connection posts 40 are inserted into the contact pads.

The display substrate 12 contact pads can be made of or include a relatively soft metal, such as tin, solder, or tin-based solder, to assist in forming good electrical contact with the connection posts 40 and adhesion with the elements. As used herein, a soft metal may refer to a metal into which a connection post 40 can be pressed to form an electrical connection between the connection post 40 and the contact pad. In this arrangement, the contact pad can plastically deform and flow under mechanical pressure to provide a good electrical connection between the connection post 40 and the contact pad.

In another embodiment of the present invention, the connection posts 40 can include a soft metal and the contact pads include a high elastic modulus metal. In this arrangement, the connection posts 40 can plastically deform and flow under mechanical pressure to provide a good electrical connection between the connection post 40 and the contact pads.

If an optional layer of adhesive is formed on the display substrate 12, the connection posts 40 can be driven through the adhesive layer to form an electrical connection with the contact pads beneath the adhesive layer. The adhesive layer can be cured to more firmly adhere the element and maintain a robust electrical connection between the connection posts 40 and contact pads in the presence of mechanical stress. The adhesive layer can undergo some shrinkage during the curing process that can further strengthen the electrical connectivity and adhesion between the connection post 40 and the contact pads.

In alternative embodiments of the present invention, the connection posts 40 of are in contact with, are embedded in, or pierce the contact pads of the element. In other or additional embodiments, either or both one or more of the connection posts 40 and the contact pads are deformed or crumpled into a non-planar shape or are deformed so that the surfaces of the connection posts 40 and the contact pads change shape on contact with each other. The deformation or crumpling can improve the electrical connection between the connection posts 40 and the contact pads by increasing the surface area that is in contact between the connection posts 40 and the contact pads. To facilitate deformation, in an embodiment the connection posts 40 have a composition softer than that of the contact pads or the contact pads have a composition softer than the connection posts 40.

In another embodiment, the contact pads are coated with an optional polymer layer that can be patterned. The connection posts 40 are driven through the polymer layer to make electrical contact with the contact pads. The polymer layer can protect the contact pads and serves to embed the connection posts 40 in the contact pads by adhering to the connection posts 40. Alternatively, a compliant polymer layer is formed beneath the contact pads to facilitate the mechanical contact made when the connection posts 40 are embedded in the contact pads. For example, a metal or metal alloy containing as gold, tin, silver, or aluminum, can be formed over a polymer layer or a polymer layer coated over a metal or metal alloy containing gold, tin, silver, or aluminum. The compliant polymer layer can also serve to adhere the connection posts 40 to the contact pads.

In some embodiments, the pixel components 20 include small integrated circuits (e.g., the pixel controller 32) or assemblies of such small integrated circuits formed in or disposed on a semiconductor wafer, for example gallium arsenide or silicon, which can have a crystalline structure. Processing technologies for these materials typically employ high heat and reactive chemicals. However, by employing transfer technologies that do not stress the pixel component 20 or substrate materials, more benign environmental conditions can be used compared to thin-film manufacturing processes. Thus, the present invention has an advantage in that flexible substrates, such as polymeric substrates, that are intolerant of extreme processing conditions (e.g. heat, chemical, or mechanical processes) can be employed for the display substrates 12 or pixel components 20. Furthermore, it has been demonstrated that crystalline semiconductor substrates have strong mechanical properties and, in small sizes, can be relatively flexible and tolerant of mechanical stress. This is particularly true for substrates having 5-micron, 10-micron, 20-micron, 50-micron, or even 100-micron thicknesses. Alternatively, the printable LED components 10 can be formed in a microcrystalline, polycrystalline, or amorphous semiconductor layer.

The micro-transfer printable elements of the present invention can be constructed using foundry fabrication processes used in the art. Layers of materials can be used, including materials such as metals, oxides, nitrides and other materials used in the integrated-circuit art. Each element can be or include a complete semiconductor integrated circuit and can include, for example, transistors. The elements can have different sizes, for example, 1000 square microns or 10,000 square microns, 100,000 square microns, or 1 square mm, or larger, and can have variable aspect ratios, for example 1:1, 2:1, 5:1, or 10:1. The elements can be rectangular or can have other shapes.

Embodiments of the present invention provide advantages over other printing methods described in the prior art. By employing connection posts 40 and a printing method that provides micro-transfer printable element on a destination substrate and connection posts 40 adjacent to the destination substrate, a low-cost method for printing elements in large quantities over a destination substrate is provided. Furthermore, additional process steps for electrically connecting the micro-transfer printable elements to the destination substrate are obviated.

The element source wafer and micro-transfer printable elements, micro-transfer printing stamps, and destination substrates can be made separately and at different times or in different temporal orders or locations and provided in various process states.

The method of the present invention can be iteratively applied to a single or multiple destination substrates. By repeatedly transferring sub-arrays of micro-transfer printable elements from a transfer stamp to a destination substrate and relatively moving the transfer stamp and destination substrates between stamping operations by a distance equal to the spacing of the selected micro-transfer printable elements in the transferred sub-array between each transfer of micro-transfer printable elements, an array of micro-transfer printable elements formed at a high density on a source wafer (e.g., pixel wafer 50) can be transferred to a destination substrate (e.g., the display substrate 12) at a much lower density. In practice, the source wafer is likely to be expensive, and forming micro-transfer printable elements with a high density on the source wafer will reduce the cost of the micro-transfer printable elements, especially as compared to micro-transfer printable elements on the destination substrate.

In particular, in the case wherein the active micro-transfer printable elements are or include an integrated circuit formed in a crystalline semiconductor material, the integrated circuit substrate provides sufficient cohesion, strength, and flexibility that it can adhere to the destination substrate without breaking as the transfer stamp is removed.

In comparison to thin-film manufacturing methods, using densely populated source substrate wafers and transferring micro-transfer printable elements to a destination substrate that requires only a sparse array of micro-transfer printable elements located thereon does not waste or require active layer material on a destination substrate. The present invention can also be used in transferring micro-transfer printable elements made with crystalline semiconductor materials that have higher performance than thin-film active components. Furthermore, the flatness, smoothness, chemical stability, and heat stability requirements for a destination substrate used in embodiments of the present invention may be reduced because the adhesion and transfer process is not substantially limited by the material properties of the destination substrate. Manufacturing and material costs may be reduced because of high utilization rates of more expensive materials (e.g., the source substrate) and reduced material and processing requirements for the destination substrate.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations a first layer on a second layer includes a first layer and a second layer with another layer therebetween.

The terms row and column are arbitrary and relative designations and can be exchanged in embodiments of the present invention.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously.

The invention has been described in detail with particular reference to certain embodiments thereof, but it will be understood that variations and modifications can be effected within the spirit and scope of the invention.

PARTS LIST

D distance
L length
W width
10 display
12 display substrate
13 fuse controller
14 row controller
15 row conductors
16 column controller
17 column conductors
18 bus
19 adhesive
20 pixel component
20R red pixel component
20G green pixel component
20B blue pixel component
21 full-color pixel component
22 LED
22R red LED
22G green LED
22B blue LED
22E redundant LED
23 LED electrical contact
24 fuse
24R red fuse 24G green fuse
24B blue fuse
25 fuse electrical contact
26 common electrical connection
28 electrode/electrical conductor
30 pixel substrate
32 pixel controller
40 connection post
42 connection post form
44 via
50 pixel wafer
52 sacrificial layer
54 sacrificial portion
56 tether
58 anchor/anchor portion
60 dielectric structure
62 encapsulation layer
70 shorted pixel component
72 pixel component
74 redundant pixel component
76 blown pixel component
78 conductor extension
100 provide display step
102 correct display
110 operate display step
120 measure operational parameter step
122 measure luminance step
124 compare luminance to standard step
126 measure current step
128 compare current to standard step
130 determine shorted LEDs step
140 blow fuses for shorted LEDs step
150 remove shorted LEDs and fuses step
160 replace shorted LEDs and fuses step
170 add redundant LEDs and fuses step

What is claimed:

1. A display having fused light-emitting diodes (LEDs), comprising:
a display substrate; and
an array of pixel components disposed on, over, or in the display substrate, each pixel component comprising:
a plurality of light-emitting diodes electrically connected in parallel, and
a common electrical fuse electrically connected in series with all of the plurality of light-emitting diodes,
wherein the common electrical fuse is an electrically conductive, sacrificial, low-resistance resistor that becomes permanently non-conductive when a pre-determined current passes through the common electrical fuse.

2. The display of claim 1, wherein each pixel component comprises a red LED that emits red light, a green LED that emits green light, and a blue LED that emits blue light, and wherein the red, green, and blue LEDs are electrically connected to a common electrical connection.

3. The display of claim 1, comprising a fuse controller that provides sufficient electrical power to render each fuse non-conductive.

4. The display of claim 3, wherein the fuse controller provides electrical power to the LEDS in a forward-biased direction.

5. The display of claim 3, wherein the fuse controller provides electrical power to the LEDS in a reverse-biased direction.

6. The display of claim 3, wherein the fuse controller provides image control signals that cause the array of LEDs to display an image and fuse control signals that can render each fuse non-conductive.

7. The display of claim 3, wherein the fuse controller is a passive-matrix controller.

8. The display of claim 3, wherein the fuse controller is an active-matrix controller and wherein each pixel component comprises a pixel controller electrically connected to the LED, the pixel controller comprising circuitry that, in combination with the fuse controller, provides sufficient electrical power to render each fuse non-conductive.

9. The display of claim 1, wherein one or more of the fuses comprises separate conductors connected in parallel.

10. The display of claim 1, wherein each pixel component comprises a pixel substrate separate, independent, distinct from the display substrate and the pixel substrates are disposed on the display substrate.

11. The display of claim 1, wherein the fuses, the LEDs, or the pixel components are provided in a micro-transfer printable component.

12. The display of claim 1, wherein each pixel component is provided in a micro-transfer printable component and either or both of the fuses and the LEDs are provided in a micro-transfer printable component.

13. A method of operating a display having fused light-emitting diodes, comprising:
providing a display, the display comprising a display substrate and an array of pixel components disposed on, over, or in the display substrate, each pixel component comprising a plurality of light-emitting diodes (LEDs) electrically connected in parallel and a common electrical fuse electrically connected in series with all of the plurality of LEDs;
operating the display to determine an operational status of the plurality of LEDs in each pixel component;
determining one or more LEDs in the array of pixel components that have an electrical short; and
providing an electrical current through the shorted one or more LEDs and through each common electrical fuse electrically connected in series to at least one of the shorted one or more LEDs that renders each common electrical fuse electrically connected in series to the at least one of the shorted one or more LEDs non-conductive,
wherein the common electrical fuse is an electrically conductive, sacrificial, low-resistance resistor that becomes permanently non-conductive when a pre-determined current passes through the common electrical fuse.

* * * * *